United States Patent
Kawashima

(10) Patent No.: US 8,365,106 B2
(45) Date of Patent: Jan. 29, 2013

(54) METHOD FOR OPTIMIZATION OF LIGHT EFFECTIVE SOURCE WHILE TARGET PATTERN IS CHANGED

(75) Inventor: Miyoko Kawashima, Haga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 326 days.

(21) Appl. No.: 12/499,754

(22) Filed: Jul. 8, 2009

(65) Prior Publication Data

US 2010/0009272 A1    Jan. 14, 2010

(30) Foreign Application Priority Data

Jul. 11, 2008   (JP) ................... 2008-181984

(51) Int. Cl.
 *G06F 17/50* (2006.01)
(52) U.S. Cl. ............... 716/54; 716/51; 430/5; 382/144
(58) Field of Classification Search ............ 716/51, 716/54; 430/5; 382/144
See application file for complete search history.

(56) References Cited

U.S. PATENT DOCUMENTS

| | | | |
|---|---|---|---|
| 5,465,220 A | 11/1995 | Haruki et al. | |
| 5,607,821 A | 3/1997 | Haruki et al. | |
| 6,045,976 A | 4/2000 | Haruki et al. | |
| 6,803,554 B2* | 10/2004 | Ye et al. | 250/208.1 |
| 7,242,459 B2* | 7/2007 | Shi et al. | 355/77 |
| 7,265,816 B2 | 9/2007 | Tsuji | |
| 7,506,299 B2 | 3/2009 | Socha et al. | |
| 2004/0229133 A1 | 11/2004 | Socha et al. | |
| 2008/0052334 A1* | 2/2008 | Yamazoe | 708/191 |

FOREIGN PATENT DOCUMENTS

| | | |
|---|---|---|
| JP | 2004-012932 A | 1/2004 |
| JP | 06-120119 A | 4/2004 |
| JP | 2004-221594 A | 8/2004 |
| JP | 2006-005319 A | 1/2006 |
| JP | 2008-040470 A | 2/2008 |

* cited by examiner

*Primary Examiner* — Naum Levin
(74) *Attorney, Agent, or Firm* — Canon U.S.A, Inc. IP Division

(57) ABSTRACT

The present invention provides a method including generating mask data to be used in an exposure apparatus including an illumination optical system and a projection optical system which projects a pattern of the mask onto a substrate, and fabricating a mask based on the generated mask data.

8 Claims, 36 Drawing Sheets

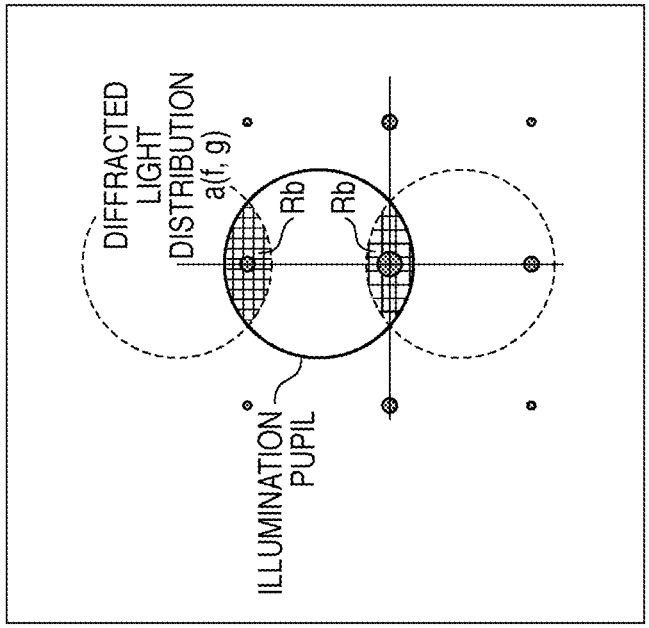
F I G. 6A-b
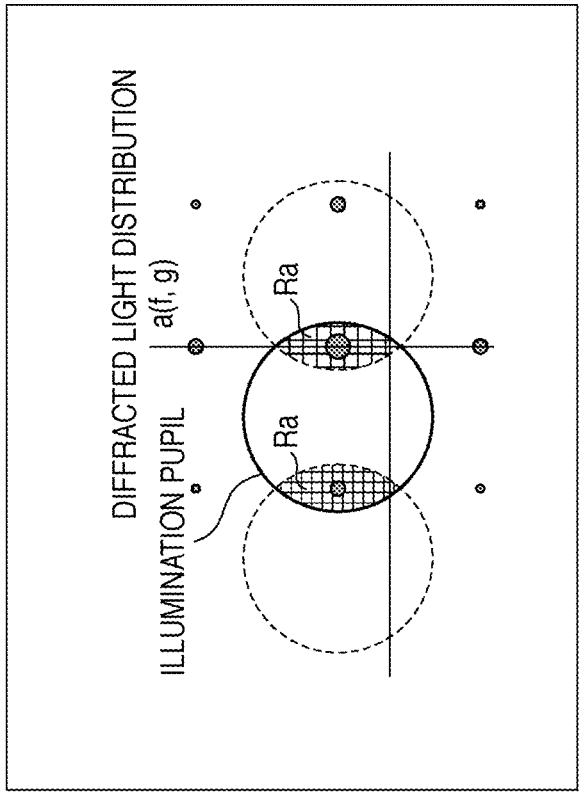
F I G. 6A-a

F I G. 11
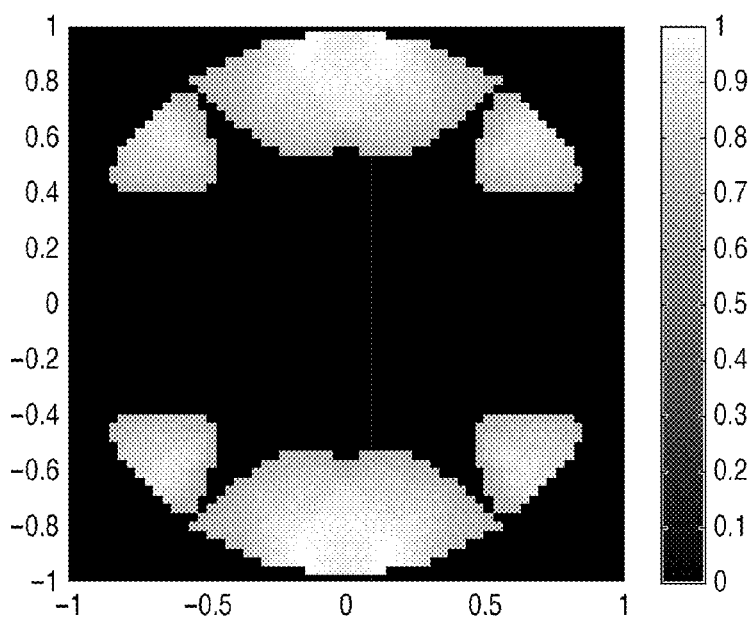

F I G. 12
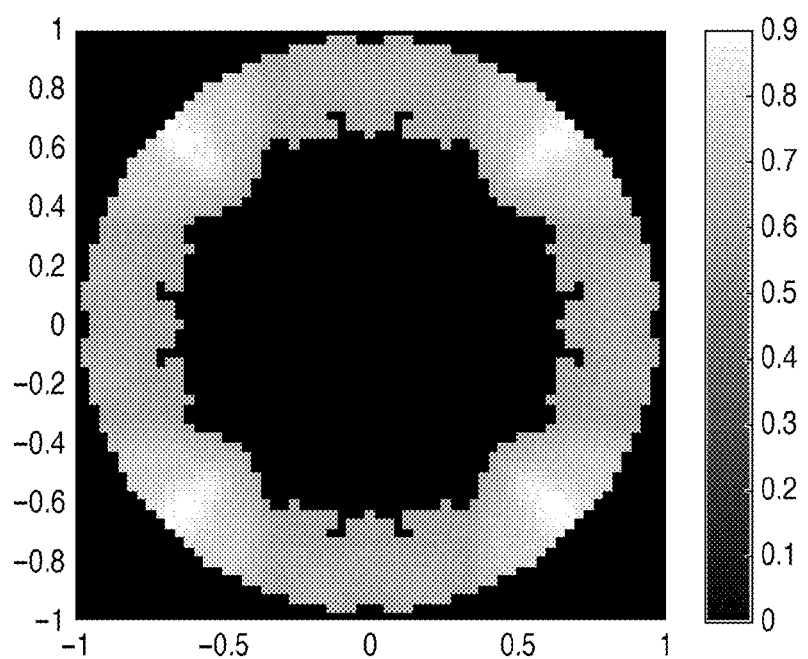

F I G. 16
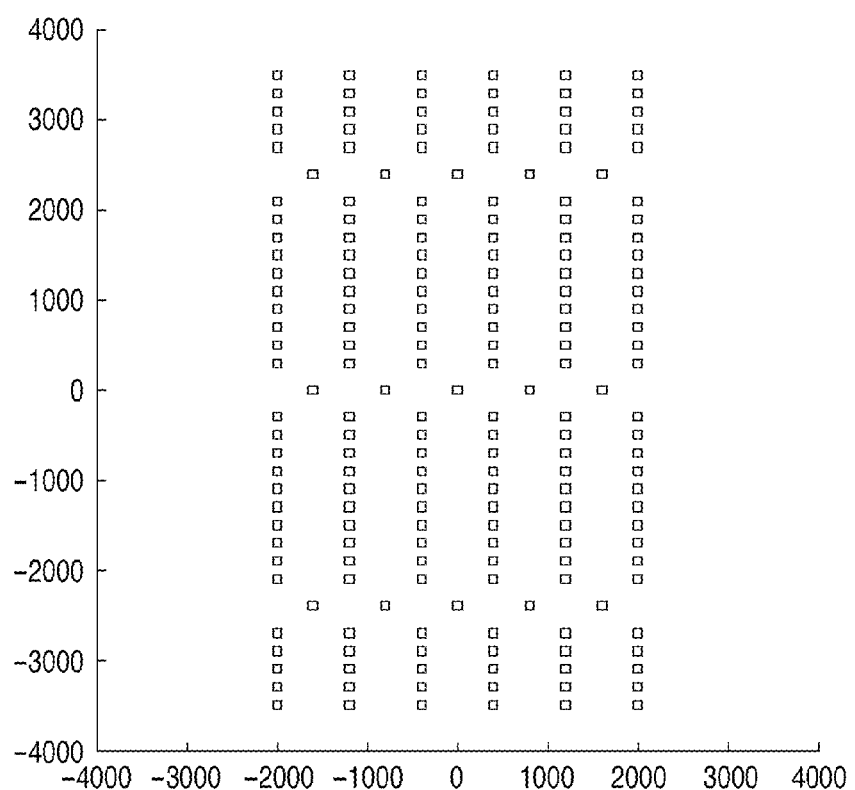

F I G. 20
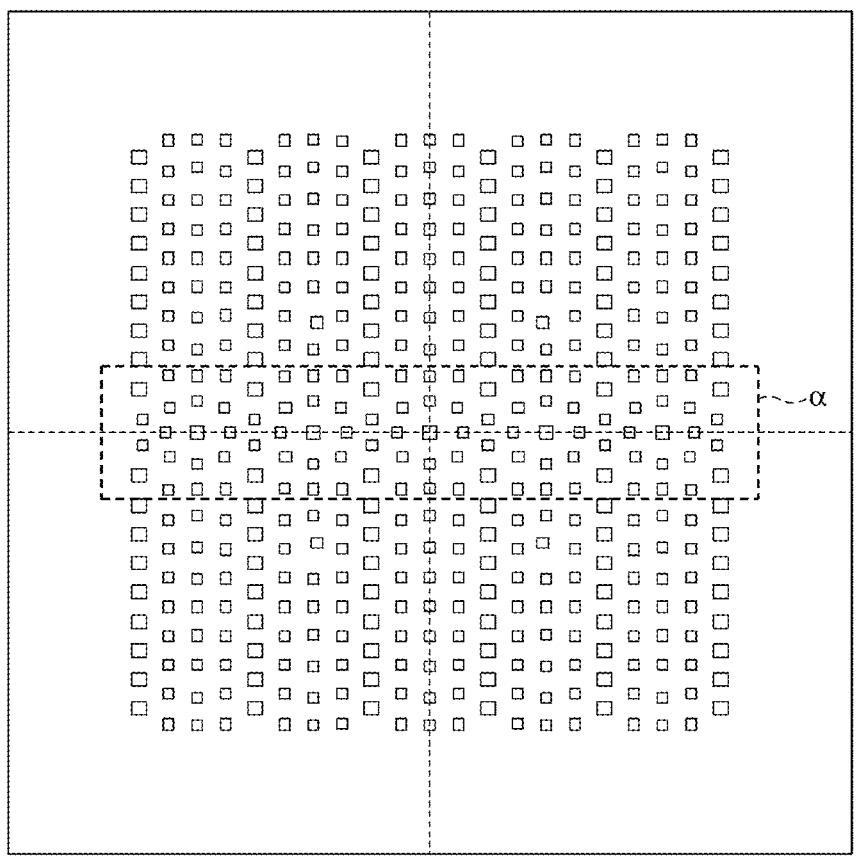

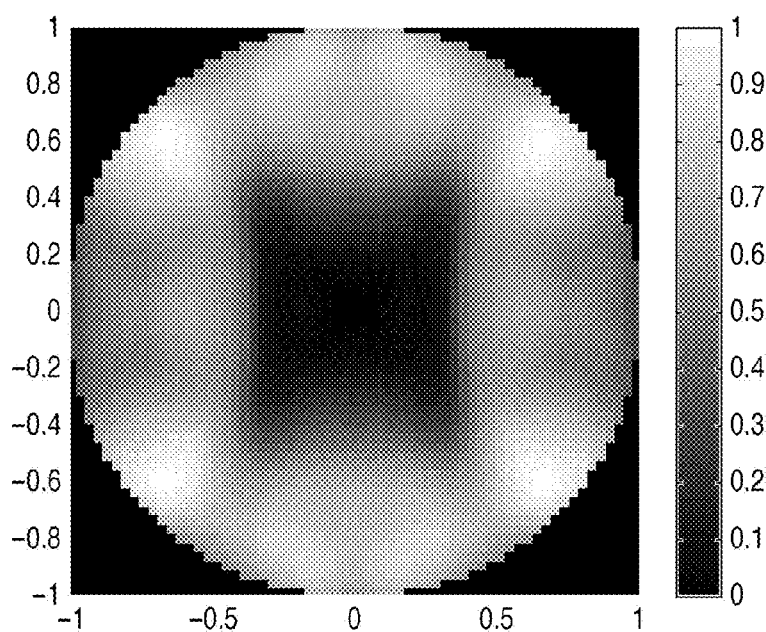
F I G. 21

F I G. 24
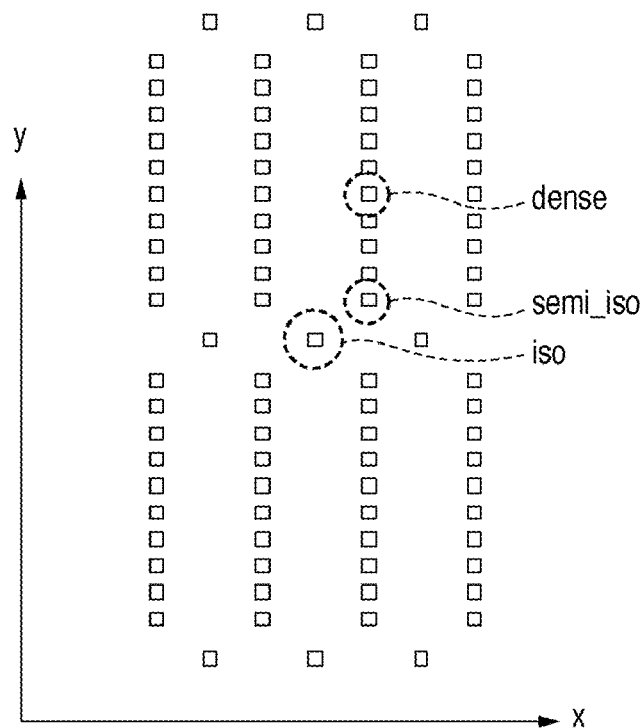

FIG. 28A
FIG. 28B
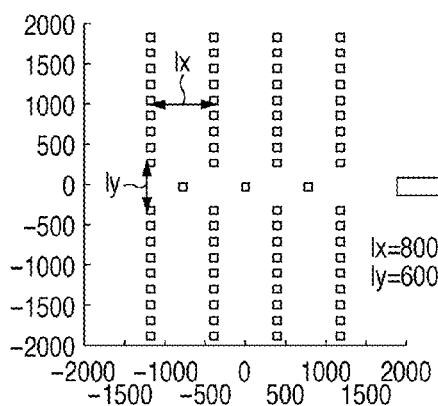
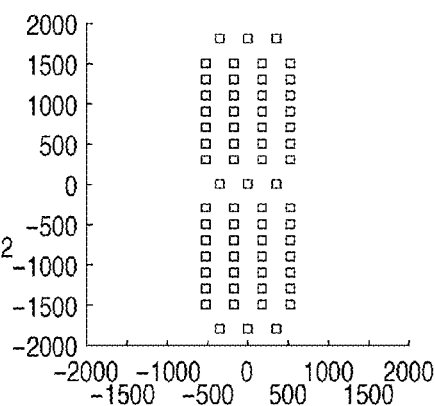
FIG. 29A
FIG. 29B
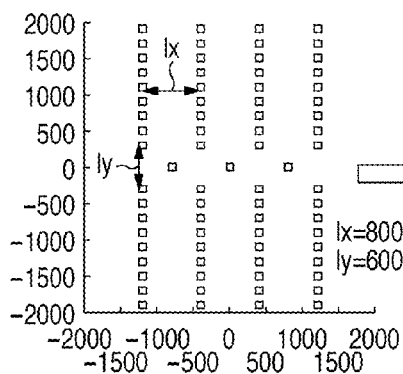
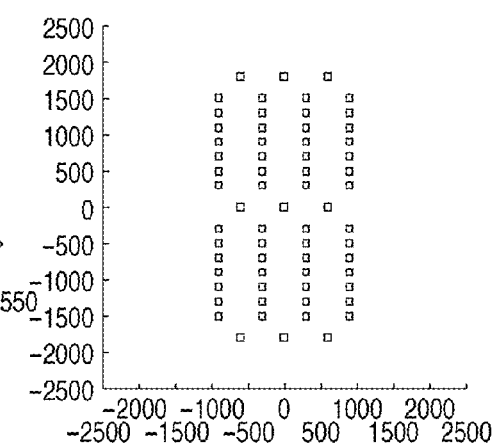

F I G. 32
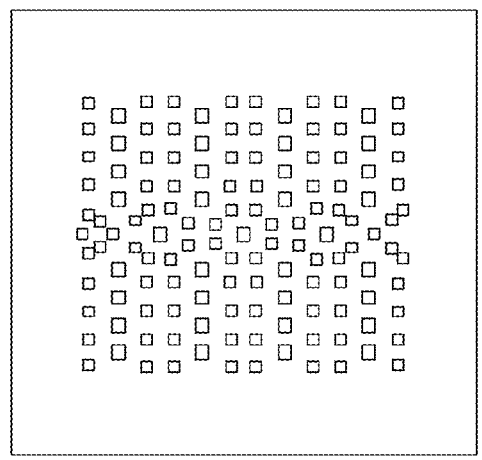
F I G. 33
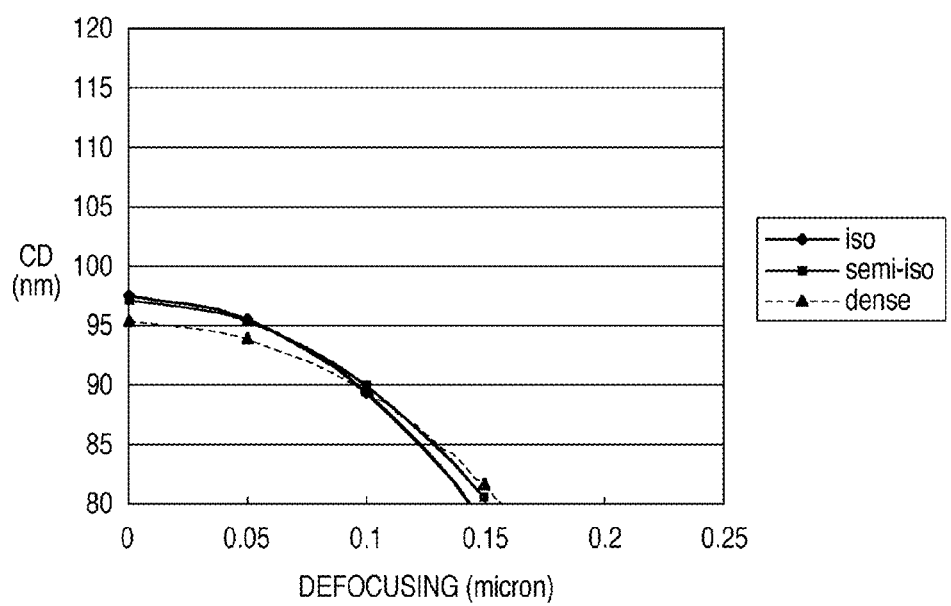

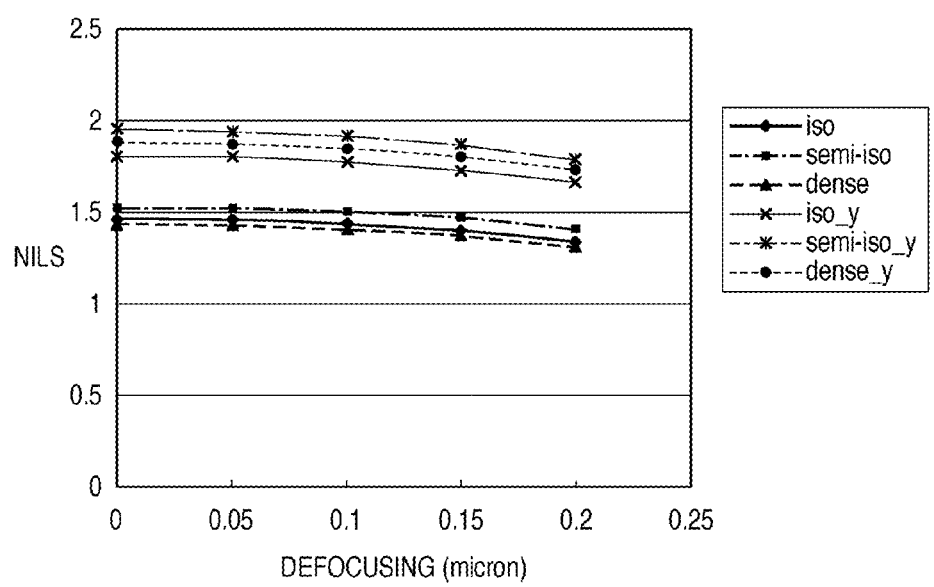
F I G. 34

METHOD FOR OPTIMIZATION OF LIGHT EFFECTIVE SOURCE WHILE TARGET PATTERN IS CHANGED

BACKGROUND OF THE INVENTION

1. Field of the Invention

The present invention relates to a mask fabrication method, exposure method, device fabrication method, and recording medium.

2. Description of the Related Art

An exposure apparatus has conventionally been used when fabricating a fine semiconductor device such as a semiconductor memory or logic circuit by using photolithography. In the exposure apparatus, a projection optical system projects patterns (circuit patterns) formed on a mask (reticle) onto a substrate such as a wafer, thereby transferring the patterns. Recently, the exposure apparatus is used to form patterns having dimensions smaller than the exposure wavelength (the wavelength of exposure light). In the resolution of such fine patterns, the image performance changes in accordance with illumination conditions (an effective source) by which a mask is illuminated. Therefore, it is important to set an optimum effective source. Ordinary, the optimization of the effective source generally uses the calculation of an optical image (aerial image). For example, a light source is two-dimensionally divided into a plurality of elements, and an element is regarded as point light source. A point source illuminates a mask, and the diffracted light from mask pattern is resolved on an image plane through the optical system. Then an optical image from the source is calculated, and a point source which contributes to the resolution of a pattern image is selected. This makes it possible to optimize the effective source (see Japanese Patent Laid-Open No. 6-120119). However, this method takes an enormous time because the optical image (aerial image) is to be calculated.

Also, since a pattern having a dimension smaller than the exposure wavelength, the pattern shape is not transferred on a wafer with accuracy. More specifically, the corner of the pattern is rounded, or the length of the pattern decreases. This largely decreases the shape accuracy of a pattern formed on a wafer.

To reduce the decrease in shape accuracy of a pattern formed on a wafer, therefore, a mask pattern is designed by performing the process of correcting the pattern shape. Also, a mask pattern is sometimes designed by performing the process of inserting an assist pattern having a dimension not to be resolved in a main pattern to be resolved on a wafer. These processes are called optical proximity correction (OPC).

The size of an image of a mask pattern is normalized by the numerical aperture (NA) of a projection optical system or a wavelength λ of exposure light, and represented by a k1(=HP×NA/λ) factor in which HP is the half pitch of the mask pattern. Recently, the k1 factor is approaching the resolution limit (k1=about 0.25) of lithography. However, the optical proximity effect increases as decreases the k1 factor, and this makes OPC very important.

OPC is generally automatically performed by a computer. When correcting a pattern shape, for example, the pattern shape is corrected for each element of the mask pattern by a rule base or a model base using optical simulation, by taking account of the shape of the element and the influence of surrounding elements.

In the model base using optical simulation, a mask pattern is deformed until a target pattern is obtained, and various methods are usable as the method of deformation. An example is an iterative improvement method by which if an optical image is partially expanded, a mask pattern is narrowed by the some amount, and if the optical image is partially narrowed, the mask pattern is expanded by the some amount. The mask pattern is thus gradually deformed while the optical image is recalculated. A method of deforming a mask pattern by using a genetic algorithm has also been proposed. However, these methods use an enormous time because the optical image (aerial image) is to be calculated a number of times until a desired pattern is obtained.

On the other hand, for the method of inserting an assist pattern in a main pattern, a technique that derives how to insert the assist pattern by numerical calculations has been disclosed (see Japanese Patent Laid-Open No. 2004-221594). In this technique, an interference map is obtained by numerical calculations, and an interference position (region) and interference cancellation position (region) on a mask are derived. In the interference position on the interference map, an assist pattern that equalizes the phase of light having passed through a main pattern and the phase of light having passed through the assist pattern is inserted. Consequently, the light having passed through the main pattern and the light having passed through the assist pattern strongly interfere with each other. This makes it possible to accurately form a target pattern on a wafer. Note that the mask surface and wafer surface have an image formation relationship, so the interference map can also be regarded as obtaining the amplitude on the image plane. Furthermore, the target pattern is an element existing on a mask and to be transferred onto a wafer.

In addition, Japanese Patent Laid-Open No. 2008-040470 has disclosed a method of numerically obtaining information of an assist pattern.

The relationship between a mask pattern and wafer pattern in an exposure apparatus is a partial coherent image formation relationship. In the partial coherent image formation, an aerial image can be calculated by obtaining the coherence on the mask surface from information of an effective source, and performing Fourier integration on the coherence and the spectral distribution (diffracted light distribution) of a mask pattern. The "coherence" herein mentioned is the degree of interference corresponding to the distance on the mask surface. Also, the "effective source" is a light intensity distribution formed on the pupil plane of a projection optical system without any mask.

The coherence of the effective source can be considered by using a transmission cross coefficient (TCC). The TCC is defined by the pupil plane of a projection optical system, and is the overlapped portion of the effective source, the pupil function of the projection optical system, and the complex conjugate of the pupil function of the projection optical system.

In Japanese Patent Laid-Open No. 2004-221594, the TCC function is two-dimensionally expressed by fixing the position of the pupil, thereby obtaining an approximated aerial image (to be referred to as an approximate aerial image hereinafter). From the approximate aerial image, an assist pattern is placed near a peak position expect for a pattern to be resolved.

The interference map of Japanese Patent Laid-Open No. 2004-221594 forms an aerial image when squared, and hence can be regarded as a kind of an approximate aerial image.

Since OPC as described above depends on an effective source, OPC is generally performed after an effective source is set. When OPC is performed, however, a pattern deforms or an assist pattern is inserted. Accordingly, the effective source set before OPC may not be optimum any longer.

Especially when setting an assist pattern for an initially effective source by the method as described above, it is sometimes difficult to insert the assist pattern, or the image performance does not improve in some cases even when the assist pattern is inserted.

This is so because the resolution performance (e.g., the contrast or depth) with respect to the pitch between pattern elements is decided by a light source. In other words, the position of interference with a main pattern is uniquely decided by a light source. In the methods disclosed in Japanese Patent Laid-Open Nos. 2004-221594 and 2008-040470, if there is no position of interference with a main pattern, it is determined that no assist pattern is to be inserted, so no assist pattern is inserted. In this case, the resolution performance degrades if an assist pattern is forcibly inserted.

Accordingly, if a light source is unsuited to resolve the pitches of a main pattern and assist pattern, the assist pattern cannot be inserted, and this makes it difficult to improve the image formation performance.

Unfortunately, no optimum light source can be obtained if the pitches of a main pattern and assist pattern and a direction connecting the main pattern position and assist pattern position are unknown.

Since an optimum effective source and optimum mask pattern are closely related as described above, an optimum combination of the effective source and mask pattern is obtained to improve the image formation performance.

SUMMARY OF THE INVENTION

The present invention provides a technique that generates data of an effective source and mask for accurately forming fine patterns.

According to one aspect of the present invention, there is provided a method including generating, by a computer, mask data to be used in an exposure apparatus including an illumination optical system and a projection optical system which projects a pattern of the mask onto a substrate; and fabricating a mask based on the generated mask data, wherein the mask data generation step includes setting a target pattern to be formed on the substrate, an effective source, and an exposure parameter settable in the exposure apparatus, calculating a first aerial image to be formed on an image plane of the projection optical system, based on the set target pattern, effective source, and exposure parameter, deciding a pattern of the mask based on the calculated first aerial image, calculating a diffracted light distribution to be formed on a pupil plane of the projection optical system based on the decided pattern, deciding a new effective source based on the calculated diffracted light distribution and the set exposure parameter, and changing the set effective source to the new effective source, calculating a second aerial image to be formed on the image plane based on the decided mask pattern, the decided new effective source, and the set exposure parameter, evaluating the calculated second, and determining whether the second aerial image satisfies an evaluation criterion, and generating the decided new effective as an effective source to be used in the exposure apparatus, if it is determined that the calculated second aerial image satisfies the evaluation criterion, and generating data containing data of the decided pattern as the mask data.

Further aspects of the present invention will become apparent from the following description of exemplary embodiments with reference to the attached drawings.

BRIEF DESCRIPTION OF THE DRAWINGS

FIGS. 6A-a and 6A-b are views for explaining that IDEAL smile illumination (the initial data of the effective source shown in FIG. 5) includes a light source that causes two-beam interference.

FIG. 6B is a view for explaining that IDEAL smile illumination (the initial data of the effective source shown in FIG. 5) includes a light source that causes three-beam interference.

FIG. 11 is a view showing an effective source (effective source data) obtained by setting an intensity of 0.7 or less to zero in the effective source shown in FIG. 10.

FIG. 12 is a view showing an effective source (effective source data) obtained by setting an intensity of 0.6 or less to zero in the effective source shown in FIG. 10 and making it rotationally symmetrical through 90°.

FIG. 16 is a view showing an example of target pattern data.

FIG. 20 is a view showing a region to be weighted in the mask pattern data shown in FIG. 8;

FIG. 21 is a view showing an example of an effective source (effective source data) obtained in the second embodiment.

FIG. 24 is a view for explaining a region where the NILS and line width (CD) are evaluated in the target pattern data shown in FIG. 4.

FIG. 28A is a view showing an undeformed target pattern, and FIG. 28B is a view showing a deformed target pattern.

FIG. 29A is a view showing an undeformed target pattern, and FIG. 29B is a view showing a deformed target pattern.

FIG. 32 is a view showing a mask pattern (mask data or deformed pattern data) obtained from the target pattern (target pattern data) shown in FIG. 29B.

FIG. 33 is a graph showing the change (evaluation amount) in line width (CD) as a function of defocusing in isolated contact holes, semi-isolated contact holes, and dense contact holes.

FIG. 34 is a graph showing the change (evaluation amount) in NILS as a function of defocusing in isolated contact holes, semi-isolated contact holes, and dense contact holes.

DESCRIPTION OF THE EMBODIMENTS

Figure 1:
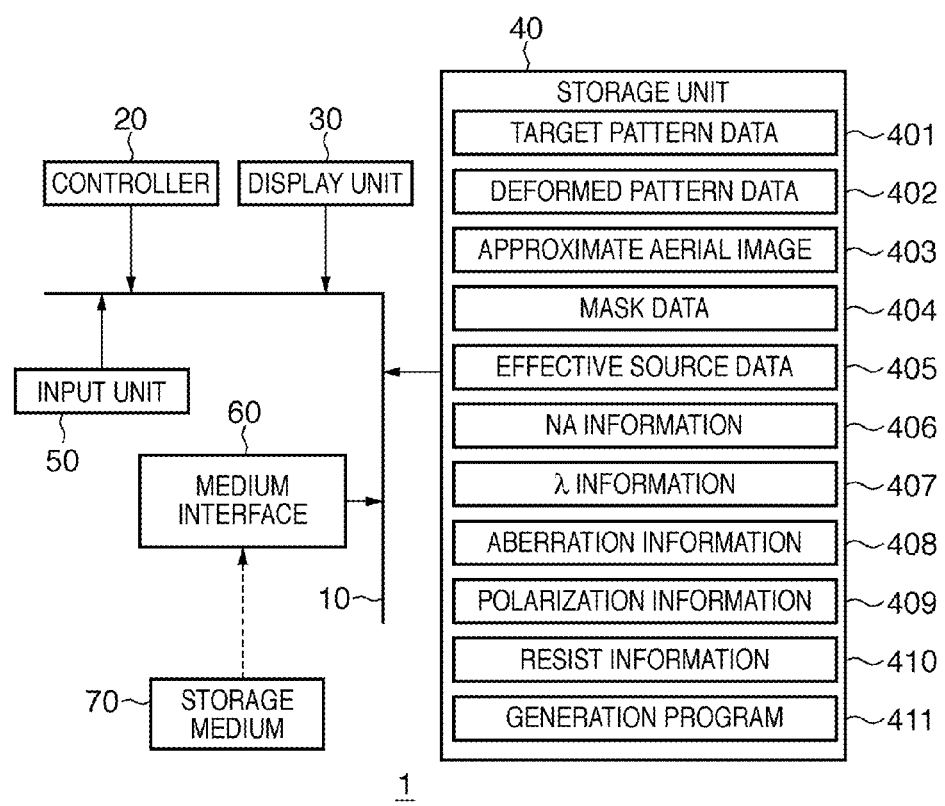
FIG. 1 is a schematic block diagram showing the arrangement of a processing apparatus for executing a generation method according to an aspect of the present invention.

Various embodiments of the present invention will be explained below with reference to the accompanying drawings. Note that the same reference numerals denote the same parts in these drawings, and a repetitive explanation will be omitted.

The present invention is applicable to the fabrication of various devices, for example, semiconductor chips such as ICs and LSIs, display devices such as liquid crystal panels, detection elements such as magnetic heads, and imaging devices such as CCDs, and the generation of data of an effective source and mask to be used in a micromechanics. The "micromechanics" herein mentioned is a technique that forms a micron-order machine system having a high-level function by applying the semiconductor integrated circuit fabrication technique to the manufacture of a microstructure, and is the machine system itself. The present invention is suitable for, for example, data of an effective source and mask for use in an exposure apparatus including a projection optical system having a large numerical aperture (NA) or an immersion exposure apparatus in which a liquid is filled between a projection optical system and wafer.

The concept disclosed in the present invention can mathematically be modeled. Accordingly, the present invention can be implemented as a software function of a computer system. The software function of the computer system includes programming having an executable software code. In this embodiment, it is possible to generate data of an effective source and the mask for accurately forming fine patterns. A processor of the computer system executes the software code. When the software code is in operation, the code or related data is stored in a computer platform. However, the software code may also be stored in another location or loaded into an appropriate computer system. Therefore, the software code can be held as one or a plurality of modules in at least one computer-readable recording medium. The present invention can be described in the form of the above-mentioned code, and can be functioned as one or a plurality of software products.

FIG. 1 is a schematic block diagram showing the arrangement of a processing apparatus 1 that executes a generation method as an aspect of the present invention. This generation method generates data of an effective source and mask for use in an exposure apparatus including an illumination optical system for illuminating a mask, and a projection optical system for projecting patterns of the mask onto a substrate such as a wafer.

The processing apparatus 1 is, for example, a general-purpose computer. As shown in FIG. 1, the processing apparatus 1 includes a bus line 10, controller 20, display unit 30, storage unit 40, input unit 50, and medium interface 60.

The bus line 10 interconnects the controller 20, display unit 30, storage unit 40, input unit 50, and medium interface 60.

The controller 20 is a CPU, GPU, DSP, or microcomputer, and includes a cache memory for temporary storage. Based on a generation program 411 activation instruction input from the user via the input unit 50, the controller 20 activates and executes a generation program 411 stored in the storage unit 40. Also, the controller 20 executes arithmetic processing concerning the generation of the data of an effective source and mask by using data stored in the storage unit 40.

The display unit 30 is a display device such as a CRT display or liquid crystal display. The display unit 30 displays information (e.g., an approximate aerial image 403 and mask data 404 (to be described later)) related to the execution of the generation program 411.

The storage unit 40 is, for example, a memory or hard disk. The storage unit 40 stores the generation program 411 provided from a storage medium 70 connected to the medium interface 60.

As input information when executing the generation program 411, the storage unit 40 stores target pattern data 401, NA information 406, λ information 407, aberration information 408, polarization information 409, and resist information 410. The storage unit 40 also stores the mask data 404 and effective source data 405, as output information after the execution of the generation program 411. In addition, the storage unit 40 stores deformed pattern data 402 and the approximate aerial image 403, as temporarily stored information during the execution of the generation program 411.

The target pattern data 401 is data of a pattern (a pattern to be formed on a substrate such as a wafer, and called a layout pattern or target pattern) obtained by layout design when designing an integrated circuit or the like. The target pattern data 401 is input information for deciding a mask pattern. In this embodiment, however, the target pattern data 401 is sometimes temporarily stored data because it is modified in some cases.

The deformed pattern data 402 is data containing a main pattern to be deformed by executing the generation program 411, and an assist pattern to be inserted by executing the generation program 411. However, the deformed pattern data 402 may also be data containing the main pattern alone and no assist data. Furthermore, the deformed pattern data 402 sometimes contains a target pattern itself as the main pattern. Note that although the main pattern is sometimes represented by a set of fine patterns, the main pattern is a series of patterns to be resolved and distinguished from an assist pattern not to be resolved.

The approximate aerial image 403 is generated during the execution of the generation program 411, and indicates the distribution of an approximate aerial image formed on the wafer surface by the interference with principal diffracted light.

The mask data 404 is data for forming a mask by writing a pattern of chromium (Cr) or the like on a substrate, and indicates a final mask pattern to be generated by executing the generation program 411. Note that the mask pattern is formed by a closed figure, and a set of these figures forms the pattern of the whole mask.

Note that the target pattern data 401, deformed pattern data 402, and mask data 404 contain information of the positions, sizes, shapes, transmittances, and phases of the main pattern and/or the assist pattern. Note also that the target pattern data 401, deformed pattern data 402, and mask data 404 further contain information of the transmittance and phase of a region (background) where the main pattern and/or the assist pattern does not exist.

The effective source data 405 is data generated by executing the generation program 411, and concerning intensity distribution (effective source) formed on the pupil plane of the projection optical system of the exposure apparatus.

The NA information 406 is information pertaining to the numerical aperture (NA) on the image plane side of the projection optical system of the exposure apparatus.

The λ information 407 is information pertaining to the wavelength of light (exposure light) emitted from the light source of the exposure apparatus.

The aberration information 408 is information pertaining to the aberration of the projection optical system of the exposure apparatus. When the projection optical system includes birefringence, the aberration information 408 also contains information concerning a phase shift produced in accordance with this birefringence.

The polarization information 409 is information pertaining to the polarization of light formed by the illumination optical system of the exposure apparatus.

The resist information 410 is information pertaining to a resist to be applied on a wafer.

The generation program 411 includes a program for generating the mask data 404, and a program for generating the effective source data 405. The generation program 411 also includes a program for evaluating the approximate aerial image 403 calculated from the mask data 404 and effective source data 405. The evaluation of the approximate aerial image 403 is to evaluate the image performance such as the line width (CD) and contrast.

The input unit 50 includes a keyboard and mouse. The user can input the input information such as the generation program 411 via the input unit 50.

The medium interface 60 includes a flexible disk drive, CD-ROM drive, and USB interface, and is designed to be connectable to the storage medium 70. Note that the storage medium 70 includes a flexible disk, CD-ROM, and USB memory, and provides the generation program 411 and other programs to be executed by the processing apparatus 1.

Figure 2:
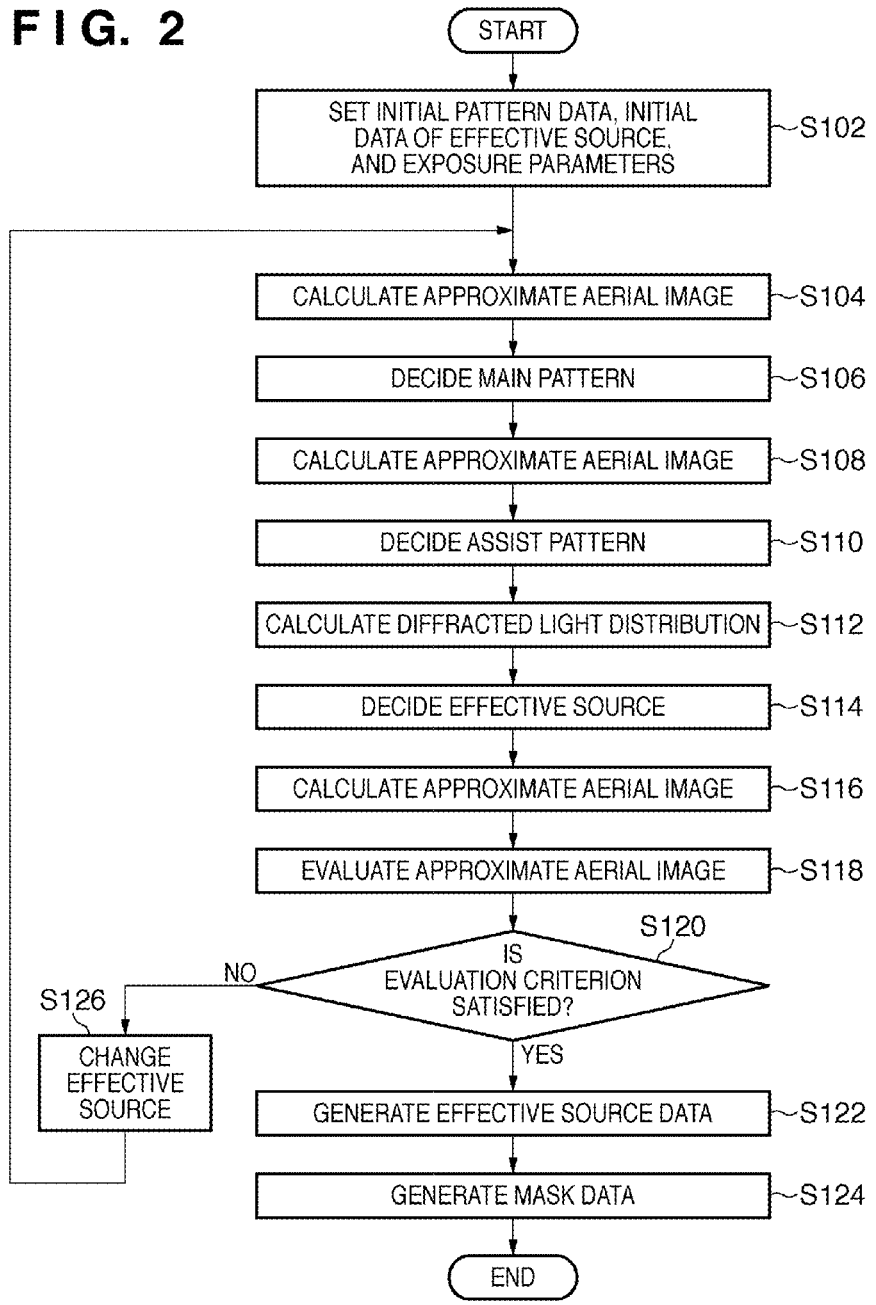
FIG. 2 is a flowchart for explaining a process by which a controller of the processing apparatus shown in FIG. 1 generates mask data and effective source data by executing a generation program.

The process by which the controller 20 of the processing apparatus 1 generates the mask data 404 and effective source data 405 by executing the generation program 411 will be explained below with reference to FIG. 2.

In step S102 (a setting step), initial pattern data of a mask pattern, initial data of an effective source, and exposure parameters (e.g., the NA information 406, λ information 407, aberration information 408, and polarization information 409) settable in the exposure apparatus are set as the input information. Note that the initial pattern data may also be the target pattern data 401. Note also that the initial data of the effective source may also be preset by the user, although the data is automatically set on the program in this embodiment. The input information (the initial pattern data, the initial data of the effective source, and the exposure parameters settable in the exposure apparatus) is input by the user via the input unit 50 and stored in the storage unit 40.

In step S104 (a first aerial image calculation step), an approximate aerial image is calculated based on the input information (the initial pattern data, the initial data of the effective source, and the exposure parameters) set in step S102.

In step S106 (a pattern decision step), a main pattern of a mask is decided (temporarily decided) based on the approximate aerial image calculated in step S104. More specifically, the main pattern is deformed (corrected) until the difference between the approximate aerial image calculated in step S104 and the target pattern data 401 falls within an allowable range. In this embodiment, it is also possible to decide the main pattern of the mask by modifying the target pattern data 401 without changing the minimum pitch of the target pattern data 401. The data of the main pattern of the mask decided in step S106 is temporarily stored as the deformed pattern data 402 in the storage unit 40.

In step S108, an approximate aerial image is calculated based on the main pattern of the mask decided (temporarily decided) in step S106, and the other input information (the initial data of the effective source and the exposure parameters set in step S102).

In step S110 (a pattern decision step), an assist pattern of the mask is decided (temporarily decided) based on the approximate aerial image calculated in step S108. More specifically, a position where the assist pattern is to be inserted in the main pattern is derived from the approximate aerial image calculated in step S108. The data of the assist pattern of the mask decided in step S110 is temporarily stored as the deformed pattern data 402 in the storage unit 40. However, the main pattern data decided in step S106 and the assist pattern data decided in step S110 are stored in the storage unit 40 as they are distinguished from each other.

Note that when deriving the position where the assist pattern is to be inserted in the main pattern from the approximate aerial image, the assist pattern insertion position can be uniquely decided. However, when the assist pattern is inserted in the main pattern, the assist pattern exerts effect on the main pattern, so the main pattern decided in step S106 may be overcorrected. In this case, the process returns to step S104 to calculate an approximate aerial image for the mask pattern including the main pattern and assist pattern decided in steps S106 and S110, and the main pattern is deformed based on this approximate aerial image. Note that the repetition of steps S104 to S110 is enough to perform once or twice because the convergence of the overcorrection of the main pattern by the assist pattern is high.

To obtain the pattern including the assist pattern, it is also possible to decide the position of the assist pattern by using rule-based OPC, and obtain deformed (corrected) pattern data. In this case, the flowchart shown in FIG. 2 is replaced with a flowchart shown in FIG. 41.

Figure 41:
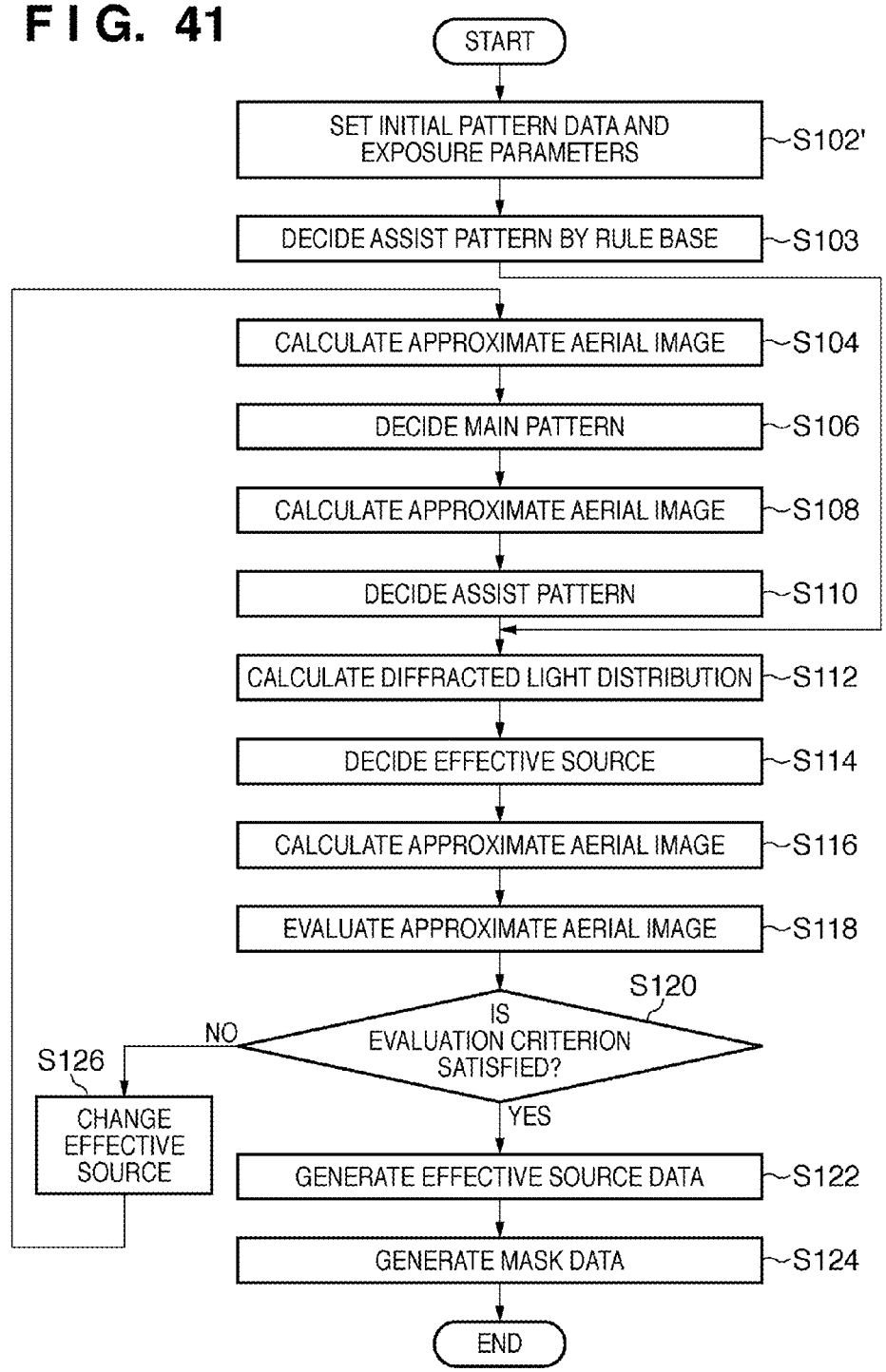
FIG. 41 is a flowchart for explaining a process by which the controller of the processing apparatus shown in FIG. 1 generates mask data and effective source data by executing a generation program.

Referring to FIG. 41, the initial pattern data and exposure parameters are set as the input information in step S102'. Then, in step S103, an assist pattern corresponding to the target pattern or to the main pattern is decided based on a pre-decided rule by using the NA information 406 or λ information 407. The rule for deciding the assist pattern can be a generally used rule. For example, a rectangular pattern is added to or deleted from the corner or the like of the pattern.

Subsequently, as shown in FIG. 41, the calculation of a diffracted light distribution (step S112), the decision of an effective source (step S114), and the like are executed by using the mask pattern including the assist pattern decided by a rule base and the main pattern. Note that processing from step S112 is the same as that of the flowchart shown in FIG. 2.

In step S112 (a diffracted light distribution calculation step), a diffracted light distribution formed on the pupil plane of the projection optical system of the exposure apparatus is calculated based on the mask pattern including the main pattern and assist pattern. Note that as described previously, the mask pattern including the main pattern and assist pattern is temporarily stored as the deformed pattern data 402 in the storage unit 40.

In step S114 (an effective source decision step), (data of) a new effective source is decided (temporarily decided) based on the diffracted light distribution calculated in step S112 and the exposure parameters settable in the exposure apparatus set in step S102 (or S102').

In step S116 (a second aerial image calculation step), an approximate aerial image is calculated. More specifically, an approximate aerial image is calculated based on the mask pattern including the main pattern and assist pattern decided in steps S106 and S110 or decided by a rule base, the effective source decided in step S114, and the exposure parameters set in step S102.

In step S118, the approximate aerial image calculated in step S116 is evaluated. More specifically, an evaluation amount such as the intensity peak, contrast, NILS (Normalized Image Log Slope), or line width of the approximate aerial image calculated in step S116 is calculated.

In step S120 (a judgment step), whether the evaluation in step S118 (i.e., the evaluation amount calculated in step S118) satisfies a predetermined evaluation criterion is judged.

If the evaluation in step S118 satisfies the evaluation criterion, (data of) the effective source decided (temporarily decided) in step S114 is generated as the effective source data 405 in step S122 (a generation step). Also, the mask pattern including the main pattern and assist pattern decided in steps S106 and S110 is generated as the mask data 404 in step S124 (a generation step).

On the other hand, if the evaluation in step S118 does not satisfy the evaluation criterion, the process advances to step S126, and (data of) the effective source is changed to the effective source decided (temporarily decided) in step S114. After that, the process returns to step S104.

Details of the individual steps of generating the mask data 404 and effective source data 405 shown in FIG. 2 will be explained below.

First, the calculation of the approximate aerial image (steps S104, S108, and S116) will be explained.

The relationship between the mask pattern and wafer pattern in the exposure apparatus is a partial coherent image formation relationship. In the partial coherent image formation, an aerial image can be calculated by obtaining the coherence on the mask surface from information of the effective source, and performing Fourier integration on the coherence and the spectral distribution (diffracted light distribution) of the mask pattern. The "coherence" is the degree of interference corresponding to the distance on the mask surface. The "effective source" is intensity distribution formed on the pupil plane of the projection optical system.

Various methods of calculating an approximate aerial image have conventionally been disclosed. For example, an approximate aerial image can be calculated by deforming the interference map disclosed in Japanese Patent Laid-Open No. 2004-221594. Let $\lambda_i$ be the ith eigen value and $\phi_i$ (f,g) be the ith eigen function when decomposing a transmission cross coefficient (TCC) into singular values. Note that (f,g) indicates the coordinates of the pupil plane of the projection optical system. Note that the TCC indicates the coherence (the degree of interference corresponding to the distance on the mask surface) of an effective source. According to Japanese Patent Laid-Open No. 2004-221594, an interference map e(x,y) is the sum of a plurality of eigen functions and can be represented by $$e(x, y) = \sum_{i=1}^{N'} \sqrt{\lambda_i} \, FT[\Phi_i(f, g)] \qquad (1)$$

where FT represents Fourier transform, and N' is normally 1.

In Japanese Patent Laid-Open No. 2004-221594, the interference map of the whole mask is derived by replacing the pattern with dots and lines, and taking convolution with the interference map. Accordingly, the interference map e(x,y) indicates simple interference.

The interference map e(x,y), however, does not take account of the mask pattern (e.g., the outer shape). When using the interference map e(x,y) to calculate an approximate aerial image, therefore, an interference map e'(x,y) taking account of the mask pattern is to be derived.

Accordingly, let $\lambda_i$ be the ith eigen value, $\phi_i$(f,g) be the ith eigen function, and a(f,g) be the diffracted light distribution of the mask pattern (Fourier transform of the pattern data), when decomposing the TCC into singular values. In this case, the interference map e'(x,y) taking account of the mask pattern can be derived from $$e'(x, y) = \sum_{i=1}^{N'} \sqrt{\lambda_i}\, FT[a(f, g)\Phi_i(f, g)] \quad (2)$$

An approximate aerial image can be calculated by using the interference map e'(x,y) indicated by equation (2).

An approximate aerial image can also be calculated by the method of Japanese Patent Laid-Open No. 2008-040470 without decomposing the TCC into singular values (eigen values).

The TCC is generally defined by the pupil plane of the projection optical system, and is the overlapped portion of the effective source, the pupil function of projection optical system, and the complex conjugate of the pupil function of the projection optical system. Letting (f,g) be the coordinates of the pupil plane of the projection optical system, S(f,g) be a function expressing the effective source, and P(f,g) be the pupil function, the TCC can be represented by a four-dimensional function as indicated by $$TCC(f',g',f'',g'') = \iint S(f,g) P(f+f', g+g') P^*(f+f'', g+g'') df dg \quad (3)$$

where * represents the complex conjugate, and the integration range is $-\infty$ to $\infty$. The aberration of the projection optical system, the polarization of illuminating light, the resist information, and the like can be incorporated into the pupil function P(f,g). In this embodiment, therefore, a simple description of the "pupil function" sometimes includes the polarization, aberration, and resist information.

To obtain a function I(x,y) expressing an aerial image by using the TCC, equation (4) below is only be calculated by letting a(f,g) be a function obtained by Fourier-transforming the function (deformed pattern data 402) expressing the mask, that is, a function expressing the spectral distribution (diffracted light distribution) of the mask.

$$I(x, y) = \sum_{f',g'} Y_{f',g'}(x, y) \quad (4)$$

where $Y_{f',g'}(x,y)$ is defined by $$Y_{f',g'}(x,y) = a(f',g') \exp[-i2\pi(f'x+g'y)] \times F^{-1}[W_{f',g'}(f'',g'')a^*(f'',g'')] \quad (5)$$

where $F^{-1}$ represents inverse Fourier transform, and $W_{f',g'}(f'',g'')$ is defined for certain fixed (f',g') by $$W_{f',g'}(f'',g'') = TCC(f',g',f'',g'') \quad (6)$$

Since (f',g') is fixed, $W_{f',g'}(f'',g'')$ is a two-dimensional function and called a two-dimensional transmission cross coefficient in this embodiment. The two-dimensional transmission cross coefficient $W_{f',g'}(f'',g'')$ is recalculated whenever the value of (f',g') changes in the addition loop of computation. When using equations (4) and (5), the TCC as a four-dimensional function is unnecessary in computation. Also, a quadruple loop has reduced to a double loop. However, the two-dimensional transmission cross coefficient $W_{f',g'}(f'',g'')$ is newly used.

The aerial image calculation method using equations (4) and (5) differs from the eigen function decomposition method (SOCS decomposition). In this embodiment, the aerial image calculation method using equations (4) and (5) will be called an aerial image decomposition method, and $Y_{f',g'}(x,y)$ defined for every coordinates (f',g') will be called a function (aerial image component) expressing the component of an aerial image.

(f',g') has a total of M combinations, and the sum of some combinations is used in the calculation of an approximate aerial image. Under the conditions, an approximate aerial image $I_{app}(x,y)$ (a function expressing an approximate aerial image) is defined by $$I_{app}(x, y) \approx \sum_{m} Y_{f',g'}(x, y) \quad (7)$$

In equation (7), an approximate aerial image means the addition of one component or two or more components for which the sum of m is smaller than M, of the aerial image component $Y_{f',g'}(x,y)$. Although a component near f'=g'=0 is effective, in some cases the component f'=g'=0 is not used.

In this embodiment, the approximate aerial image is calculated by using one aerial image component $Y_{f',g'}(x,y)$ in equation (7). However, it is also possible to use the sum of two or more aerial image components $Y_{f',g'}(x,y)$.

Next, the decision of the main pattern (step S106) will be explained. When deciding the main pattern, a two-dimensional image is extracted as the main pattern from the approximate aerial image. More specifically, a two-dimensional image in the section of the approximate aerial image is extracted by setting a reference slice value (Io). For example, when the mask pattern is a transmitting pattern, a portion where the intensity of the approximate aerial image is equal to or larger than a predetermined value (freely settable threshold value) is extracted as the two-dimensional image. When the mask pattern is a light-shielding pattern, a portion where the intensity of the approximate aerial image is equal to or smaller than the predetermined value is extracted as the two-dimensional image. The extracted two-dimensional image is compared with the target pattern, and the main pattern is decided by deforming it by the difference between the two-dimensional image and target pattern.

The decision of the assist pattern (step S110) will now be explained. When deciding the assist pattern, a position (assist pattern insertion position) where the assist pattern is to be inserted is extracted from the approximate aerial image. The assist pattern insertion position is a peak position where the light intensity has a peak (maximal value or minimal value) in a region that does not exceed the reference slice value (Io) and does not overlap the main pattern (i.e., a region except for a region onto which the target pattern is to be projected). It should be noted that the assist pattern insertion position is actually that position on the mask, which corresponds to the peak position. The size of the assist pattern is decided based on the light intensity in this peak position, and the assist pattern having the decided size is inserted into the assist pattern insertion position. all the assist patterns may also have the same size.

The calculation of the diffracted light distribution (step S112) and the decision of the effective source (step S114) will be explained below. In this embodiment, the effective source is decided (optimized) from only the diffracted light (the diffracted light distribution formed on the pupil plane of the projection optical system) of the mask pattern having performed OPC, that is, the mask pattern in which the main pattern is deformed (corrected) and the assist pattern is inserted.

Light diffracted by the mask pattern forms a diffracted light distribution on the pupil plane of the projection optical system. Let a(f,g) be the diffracted light distribution, and the coordinates (f,g) on the pupil plane of the projection optical system are normalized as the pupil radius is 1. Also, let circ(f−f',g−g') be a function that is 1 within a radius of 1 around the coordinates (f',g'), and 0 in other portions. In addition, let w(f,g) be the weighting function of the diffracted light.

First, multiple integral represented by equation (8) below is calculated within the ranges of |f'|≦2 and |g'|≦2, and equation (9) below is calculated.

$$S_{raw}(f,g) = \iint w(f,g)a(f,g)circ(f-f',g-g')df'dg' \qquad (8)$$

$$S(f,g) = S_{raw}(f,g)circ(f,g) \qquad (9)$$

Then, S(f,g) calculated from equation (9) is used as the set value of the intensity distribution (effective source data) of the effective source. In equation (9), the circ function may also be a function that is 1 when the radius is smaller than a maximum σ of the optical system, and 0 in other cases.

When simultaneously resolving a plurality of mask patterns, an effective source Si(f,g) corresponding to each mask pattern i is calculated from equation (9), and the calculated effective sources are added. In this case, a weight $Wp_i$ may also be added to the mask pattern i in accordance with the mask pattern (i.e., based on the pattern configuration ratio or the relative difficulty of resolution), as indicated by $$S(f,g) = \sum_i S_i(f,g) w p_i \qquad (10)$$

Figure 3:
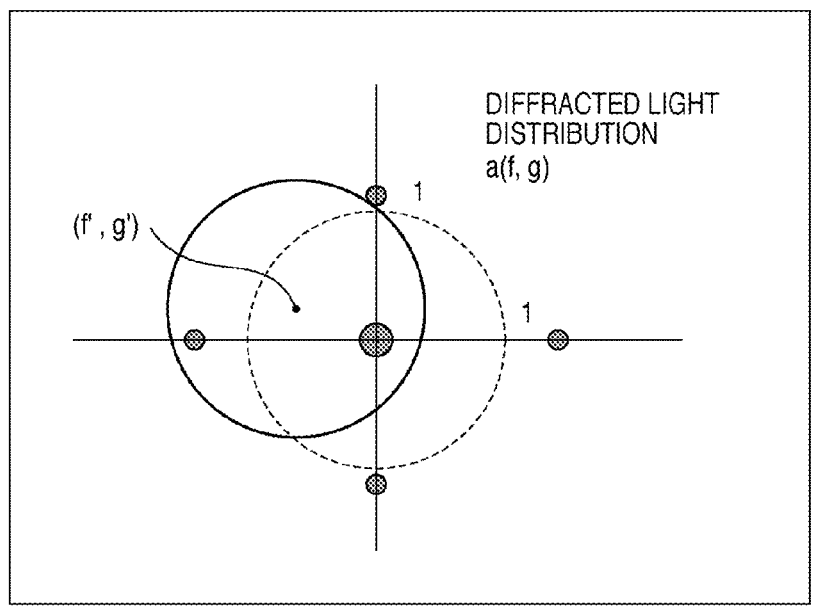
FIG. 3 is a view for explaining a method of deriving the intensity distribution of an effective source.

A method of deriving the intensity distribution of the effective source will be explained below with reference to FIG. 3. The coordinates (f,g) on the pupil plane of the projection optical system are normalized as the pupil radius is 1. Let a(f,g) be the distribution (diffracted light distribution) of diffracted light from the mask pattern. FIG. 3 conceptually shows the diffracted light distribution. Each gray circle represents a peak portion of the diffracted light.

When the center of the pupil of the projection optical system has coordinates (f',g'), diffracted light positioned inside a circuit centering around the coordinates (f',g') and having a radius of 1 passes the pupil of the projection optical system. Accordingly, the distribution of the diffracted light entering the pupil of the projection optical system is obtained by multiplying a(f,g) by the circ function.

The effective source distribution is obtained by moving the center of the pupil of the projection optical system within the ranges of |f'|≦2 and |g'|≦2 on the pupil plane, and adding diffracted light entering the pupil of the projection optical system. The effective source (data of the effective source) can be obtained by cutting the radius (a maximum value is σ) of the optical system from the effective source distribution in accordance with equation (8).

In this embodiment, the effective source is decided without calculating any aerial image. This makes it possible to obtain the effective source within a very short time. Accordingly, the effective source can be obtained for a few ten sec even when the number (pupil division number) of divided pupils of the projection optical system is 64×64. Therefore, the pupil division number can be further increased.

Next, the evaluation of the approximate aerial image (step S118) will be explained below. In this embodiment, the difference between the main pattern (two-dimensional image) extracted from the approximate aerial image and the target pattern is evaluated. Similar to the evaluation of a strict aerial image, the approximate aerial image can be evaluated by using, for example, the intensity peak, contrast, NILS, or CD (critical dimension) Also, the approximate aerial image can be evaluated more practically by adding the aberration or defocusing.

The approximate aerial image and a strict aerial image are not the same, but the evaluation results are almost the same. If the difference between the evaluation results of the approximate aerial image and strict aerial image may cause an issue, it may evaluate both the approximate aerial image and strict aerial image in advance, and correct the evaluation result (evaluation amount) of the approximate aerial image based on the difference between the evaluation results. For example, when the OPC of main pattern is performed, the strict aerial image may be calculated the strict aerial image to optimize the mask data 404 again after the mask data 404 and effective source data 405 are optimized (decided).

As described above, the processing of the generation program 411 of this embodiment can generate the mask data 404 and effective source data 405. The mask data 404 is generated using the approximate aerial image 403, and the effective source data 405 is generated without calculating any aerial image. Also, no strict aerial image is to be calculated in this embodiment. Accordingly, the calculation time can be made shorter than that of the conventional method by simplifying the whole numerical calculation, and the embodiment is advantageous from the viewpoint of a computer memory as well.

The mask data 404 generated by the processing apparatus 1 is given as a GDS file to an electron beam (EB) lithography system, and a mask is fabricated by writing patterns of, for example, Cr corresponding to the mask data 404 on a substrate.

Also the effective source data 405 generated by the processing apparatus 1 is given to an illumination optical system (a control system for controlling the illumination optical system) of the exposure apparatus, and an effective source corresponding to the effective source data 405 is formed. If the effective source data 405 has a complicated shape and intensity distribution, a diffractive optical element such as a computer generated hologram (CGH) can be used. This makes it possible to form an effective source corresponding to the effective source data 405 without decreasing the illumination efficiency. This technique is disclosed in, for example, Japanese Patent Laid-Open No. 2006-5319.

The diffractive optical element, for example, is designed to form a desired intensity distribution on the Fourier transform surface, and uses the CGH, an amplitude distribution type or phase distribution type kinoform, or the like. The CGH is a hologram fabricated by calculating an interference pattern formed by the interference between object light and reference light, and directly outputting the calculation result to a lithography system. The interference pattern for obtaining the desired intensity distribution can easily be obtained by optimization using repetitive calculations by a computer.

In the following first to third embodiments, the process of generating the mask data 404 and effective source data 405 by executing the generation program 411 will be described in detail.

In these embodiments, the wavelength of exposure light is 248 nm, and the NA of the projection optical system is 0.86. Also the projection optical system is aberration-free, the illumination light is polarization-free, and no resist is taken into account.

Each embodiment will be explained by a transmitting pattern, that is, a so-called positive pattern as an example. However, the present invention is of course applicable to a light-shielding pattern, that is, a so-called negative pattern.

In step S102, the initial pattern data of the mask pattern, the initial data of the effective source, and the exposure parameters settable in the exposure apparatus are set. In a first embodiment, target pattern data is set as the initial pattern data. Also, as the exposure parameters, 0.86 is set as NA information 406, and 248 nm is set as λ information 407. Note that "none" is set as aberration information 408, polarization information 409, and resist information 410.

Figure 4:
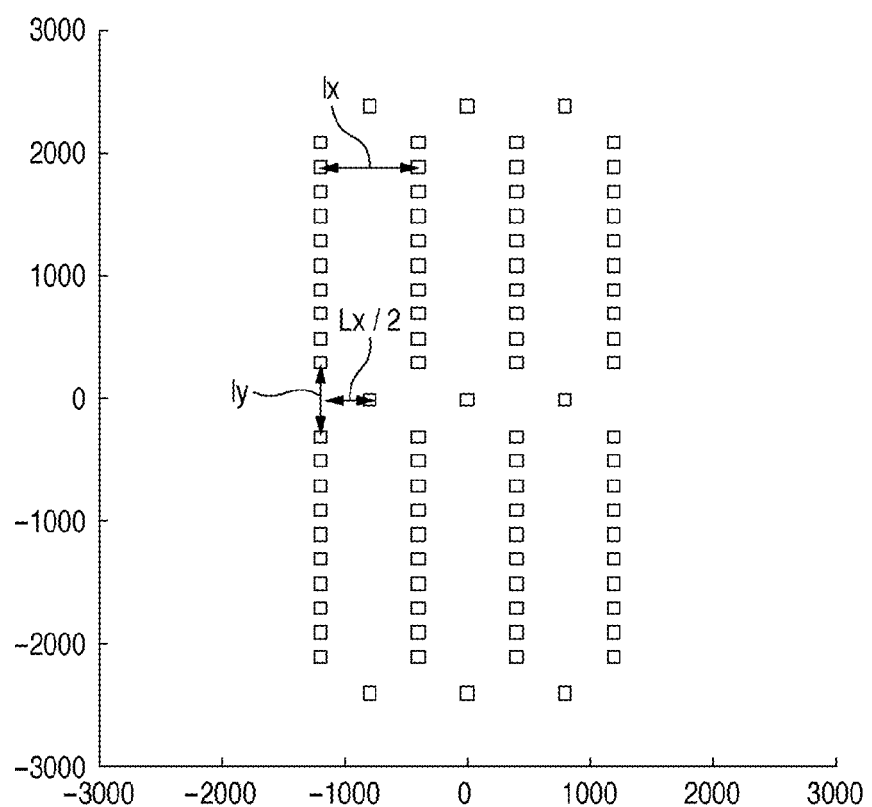
FIG. 4 is a view showing target pattern data in the first embodiment.

As shown in FIG. 4, the target pattern data is a flash memory pattern in which square contact holes of 100 nm side are arranged at a minimum pitch of 200 nm. In the following explanation of the mask pattern, the ordinate in each drawing indicates the y-coordinate of the mask surface, the abscissa in each drawing indicates the x-coordinate of the mask surface, and the units of these coordinates are nm. FIG. 4 shows the target pattern data in the first embodiment.

Figure 5:
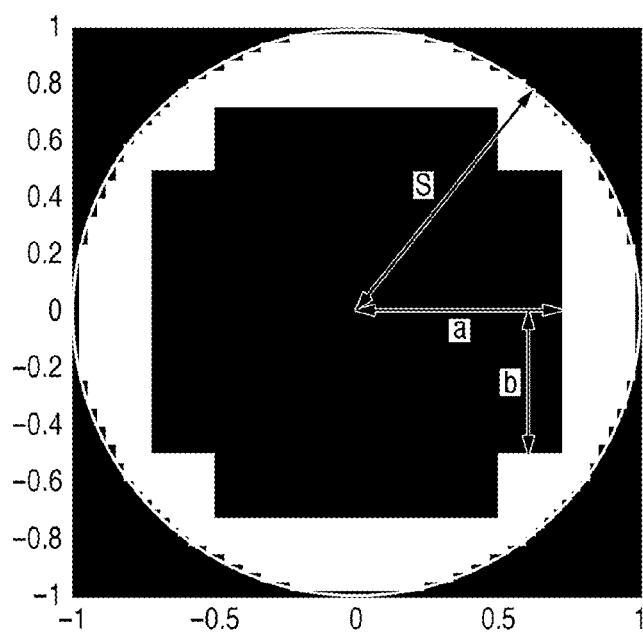
FIG. 5 is a view showing initial data of the effective source in the first embodiment.

Also, as shown in FIG. 5, the initial data of the effective source is so-called IDEAL smile illumination in which two rectangular light-shielding portions are crossed. Referring to FIG. 5, a white portion is a light-emitting portion. FIG. 5 shows the initial data of the effective source in the first embodiment.

The IDEAL smile illumination (the initial data of the effective source shown in FIG. 5) is suitable for an effective source of hole pattern. This is so because the IDEAL smile illumination includes the following light sources when resolving a hole pattern. That is, the IDEAL smile illumination includes the light sources that cause two-beam interference, three-beam interference, and four-beam interference. This will be explained below with reference to FIGS. 6A to 6D. FIGS. 6A to 6D each exemplarily illustrate the diffracted light distribution on the pupil plane, and indicate the relationship between the illumination pupil and effective source. Referring to FIGS. 6A to 6D, each gray circle indicates the diffracted light. More specifically, each large circle indicates the 0th-order diffracted light, and each small circle indicates the first-order or higher-order diffracted light.

FIGS. 6A-$a$ and 6A-$b$ indicate incident light from the light source, that is, two-beam interference by which the 0th-order diffracted light and first-order diffracted light interfere with each other. Referring to FIGS. 6A-$a$ and 6A-$b$, when the 0th-order diffracted light passes through a region or the first-order diffracted light passes through a region Ra or Rb, so the 0th-order diffracted light and first-order diffracted light interfere with each other. The light source that causes two-beam interference should have one or more of the portions (the regions Ra) where a circle with the same radius as a pupil and a pupil overlap each other as shown in FIG. 6A-$a$. This light by shifting the zero order light is in the position of the maximum±1 order diffracted beam accepted by the lens. Image formation now occurs by the interference of two beams being the zero order and either the +1 or −1 diffracted beam. A half pitch K1 of the pattern that causes two-beam interference is K1>0.25.

Figure 6B:
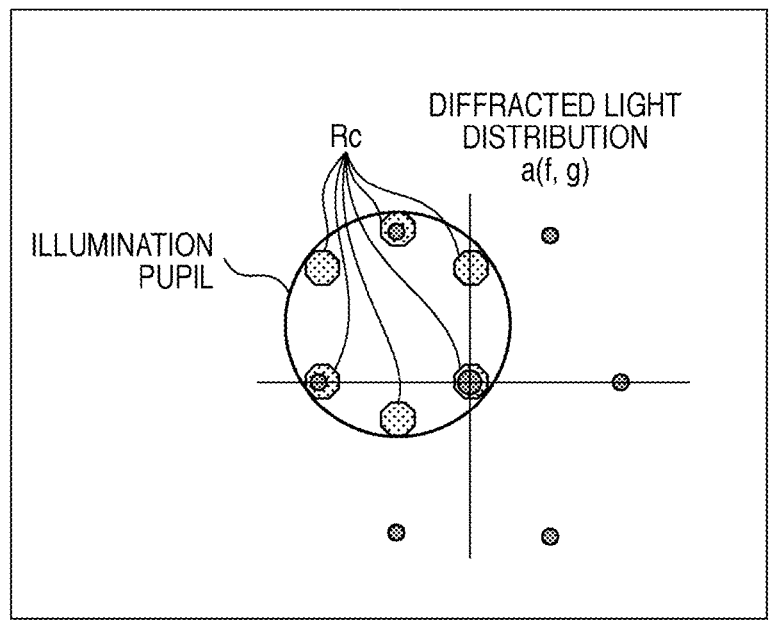

FIG. 6B shows three-beam interference by which the 0th-order diffracted light and two diffracted light (first-order or higher-order diffracted light) interfere with each other. The light source that causes three-beam interference should have portions (regions Rc) where six circles with the same radius as a pupil and a pupil overlap as shown in FIG. 6B. The half pitch K1 of the pattern that causes three-beam interference is K1>0.33.

Figure 6C:
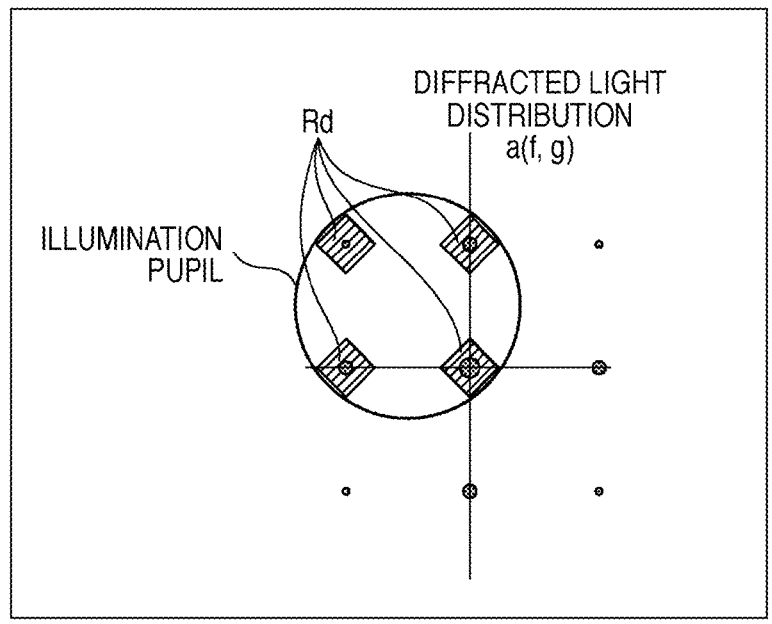
FIG. 6C is a view for explaining that IDEAL smile illumination (the initial data of the effective source shown in FIG. 5) includes a light source that causes four-beam interference.

FIG. 6C shows four-beam interference by which the 0th-order diffracted light and three diffracted light (first-order or higher-order diffracted light) interfere with each other. The light source that causes four-beam interference should have portions (regions Rd) where four circles with the same radius as a pupil and a pupil overlap as shown in FIG. 6C. The half pitch K1 of the pattern that causes four-beam interference is K1>0.35.

Figure 6D:
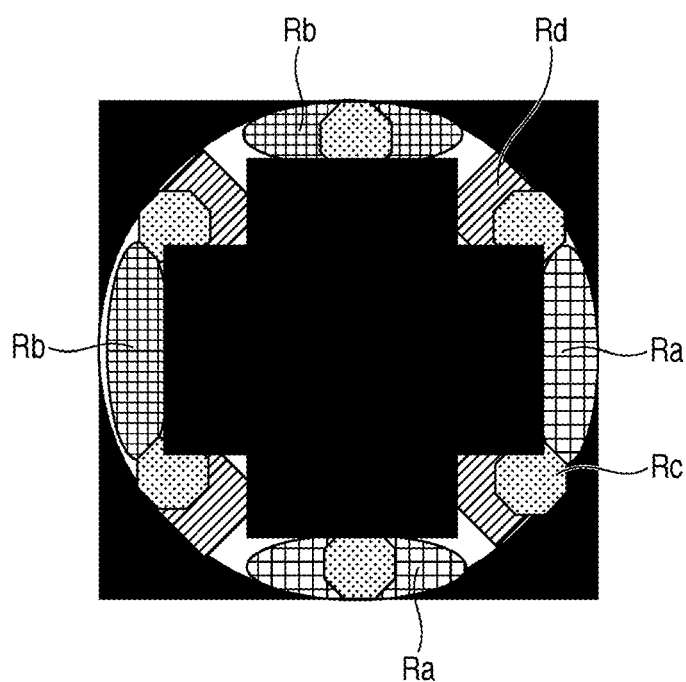
FIG. 6D is a view for explaining that IDEAL smile illumination (the initial data of the effective source shown in FIG. 5) includes a light source that causes two-beam interference, three-beam interference, and four-beam interference.

FIG. 6D shows the regions Ra to Rd shown in FIGS. 6A to 6C by overlaying these regions. Referring to FIG. 6D, the illumination shape is almost the same as that of the initial data of the effective source shown in FIG. 5. It is also possible to separately use the regions Ra and Rb shown in FIGS. 6A-$a$ and 6A-$b$, the regions Rc shown in FIG. 6B, and the regions Rd shown in FIG. 6C as the initial data of the effective source, without overlying the regions Ra to Rd shown in FIGS. 6A to 6C. Also, when the target pattern data is a line pattern, two-beam interference is important. Therefore, it is favorable to form quadrupole illumination by overlaying the regions Ra and Rb shown in FIGS. 6A-$a$ and 6A-$b$.

Details of the target pattern data (initial pattern data) shown in FIG. 4 and the initial data of the effective source shown in FIG. 5 will now be explained.

In the target pattern data shown in FIG. 4, dense contact holes are arranged in the column direction at a period of lx=800 (nm). Isolated contact holes are arranged such that the central position is spaced apart by lx/2=400 (nm) and ly/2=300 (nm) from the center of each of the dense contact holes. The target pattern data shown in FIG. 4 will be referred to as a pattern P0 hereinafter.

In the initial data of the effective source shown in FIG. 5, S=0.98, a=0.70, and b=0.50. Note that S is σ of the illumination optical system (the ratio of the NA of the illumination optical system to that of the projection optical system). The initial data of the effective source shown in FIG. 5 will be referred to as an effective source EFS0 hereinafter.

Figure 7:
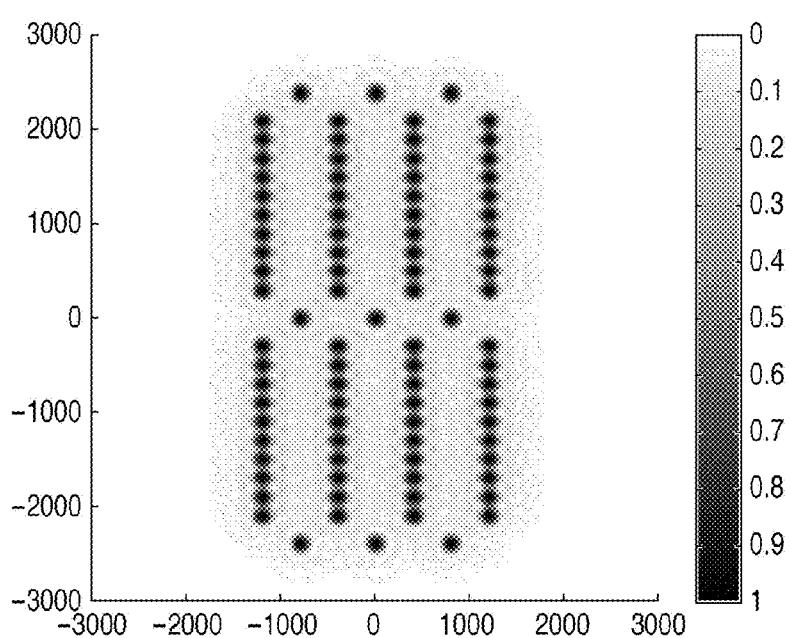
FIG. 7 is a view showing an example of an approximate aerial image calculated in the first embodiment.

In step S104, an approximate aerial image 403 is calculated. In the first embodiment, deformed pattern data 402 is target pattern data 401, that is, a square contact hole of 100 nm side. An approximate aerial image as shown in FIG. 7 is obtained by calculating $Y_{0,0}(x,y)$ as the approximate aerial image 403.

Figure 8:
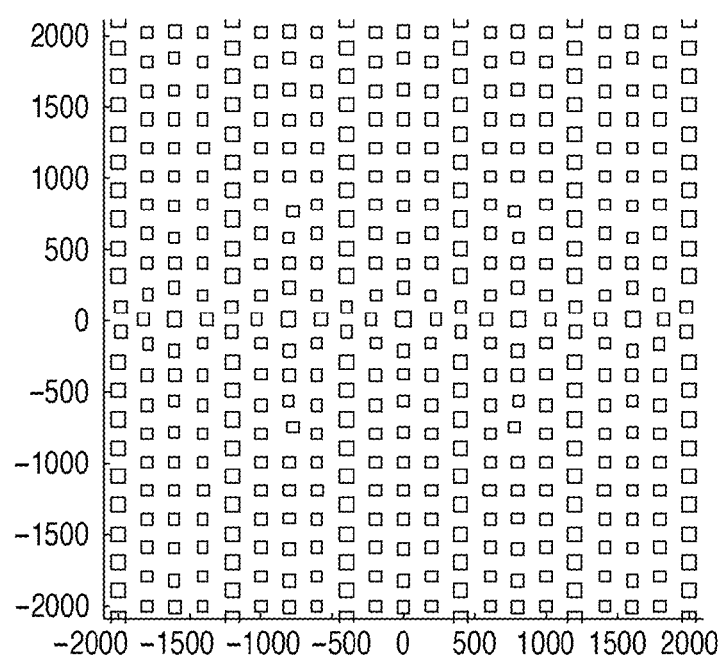
FIG. 8 is a view showing an example of mask pattern data obtained in the first embodiment.

An assist pattern is inserted through steps S106, S108, and S110. In the first embodiment, deformed pattern data 402 as shown in FIG. 8 is obtained by inserting the assist pattern without deforming the main pattern (contact hole). The deformed pattern data 402 shown in FIG. 8 has information of the pattern central position, the pattern size, transmittance=1, phase=0, background transmittance=0, and background phase=0, and contains a square main pattern of 100 (nm) side, and a square assist pattern of 80 (nm) side. The deformed pattern data 402 shown in FIG. 8 will be referred to as a pattern P1 hereinafter.

Figure 9:
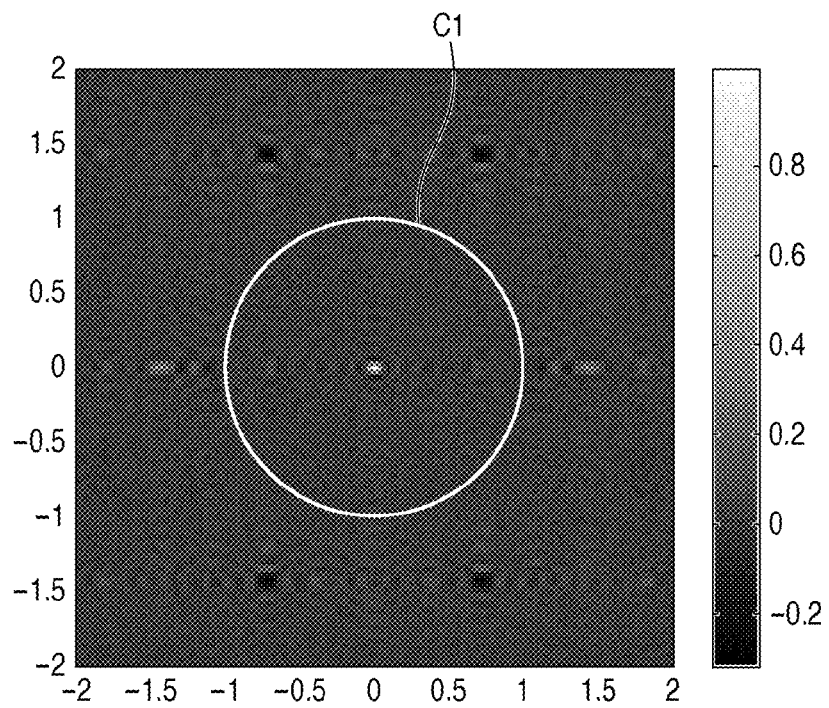
FIG. 9 is a view showing an example of a diffracted light distribution calculated in the first embodiment.

In step S112, a diffracted light distribution to be formed on the pupil plane of the projection optical system is calculated based on the pattern P1, thereby obtaining a diffracted light distribution as shown in FIG. 9. Referring to FIG. 9, a circle C1 indicates a pupil radius of 1.

Figure 10:
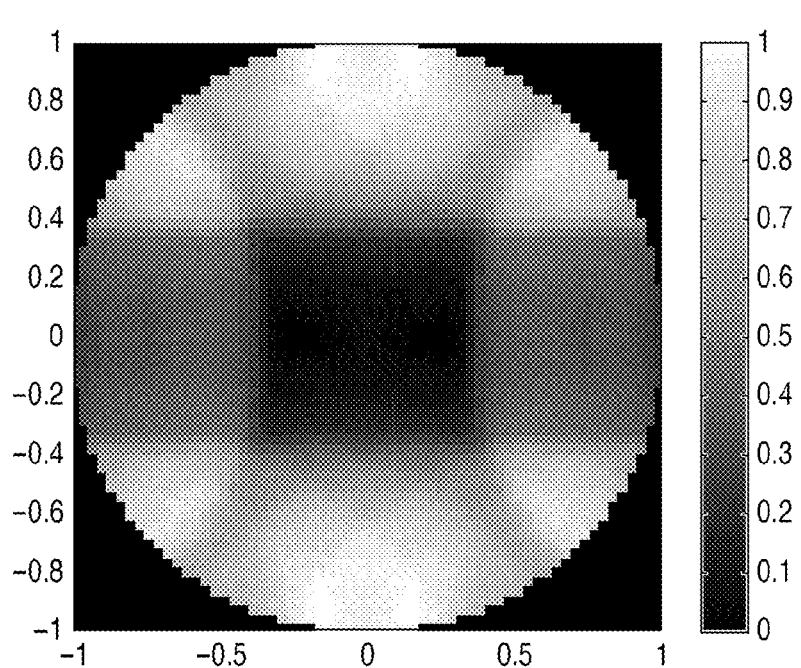
FIG. 10 is a view showing an example of an effective source (effective source data) obtained in the first embodiment.

In step S114, an effective source (effective source data) is decided (temporarily decided) from equations (8) and (9) by using the diffracted light distribution shown in FIG. 9, thereby obtaining an effective source as shown in FIG. 10. The effective source shown in FIG. 10 will be referred to as an effective source EFS1 hereinafter. Note that in the effective source EFS1, a maximum value of the intensity is normalized to 1. FIG. 11 shows an effective source obtained by setting an intensity of 0.7 or less to zero in the effective source EFS1.

This effective source will be referred to as an effective source EFS10 hereinafter. Similarly, FIG. 12 shows an effective source obtained by setting an intensity of 0.6 or less to zero in the effective source EFS1 and making it rotationally symmetrical through 90°. This effective source will be referred to as an effective source EFS11 hereinafter.

When deciding (optimizing) an effective source, the symmetry of the effective source from the symmetry of the mask pattern is taken into account. Also, the effective source should be symmetrical with respect to the x- and y-axes from the symmetry of defocusing. Accordingly, the effective source is symmetrical in the periodic direction of the mask pattern and in a direction perpendicular to the periodic direction.

Furthermore, in the first embodiment, a plurality of effective sources are decided by changing the threshold value (e.g., by setting an intensity of 0.7 or less or 0.6 or less to zero), in order to obtain maximum image performance. In steps S118 and S120, an approximate aerial image is calculated based on the effective source in which an intensity lower than a predetermined threshold value is zero, the pattern P0, and the exposure parameters, and a two-dimensional image of this approximate aerial image is evaluated. This evaluation is repeated by changing the threshold value. As a consequence, an effective source by which the maximum image performance is obtained can be decided by taking account of limitations such as the maximum σ of the illumination optical system.

Figures 13A, 13B:
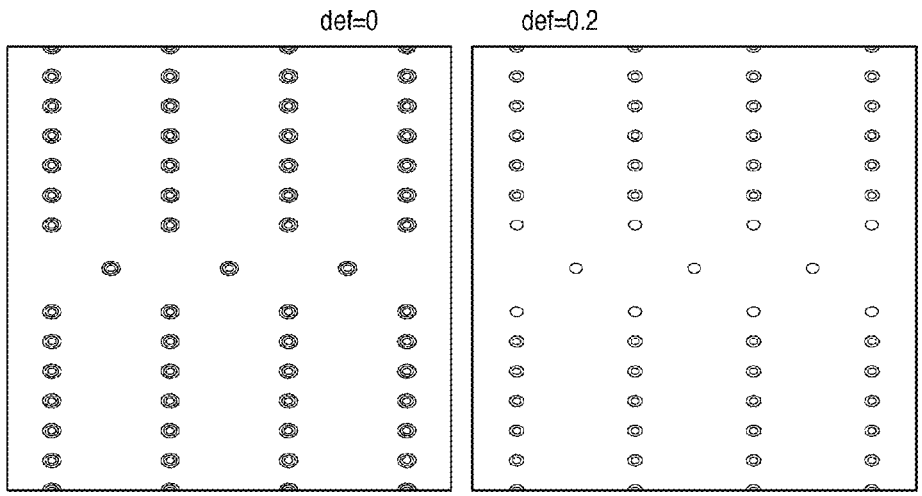
FIGS. 13A and 13B are views showing two-dimensional images of aerial images when the pattern shown in FIG. 8 is illuminated by using the effective source shown in FIG. 11.
Figures 14A, 14B:
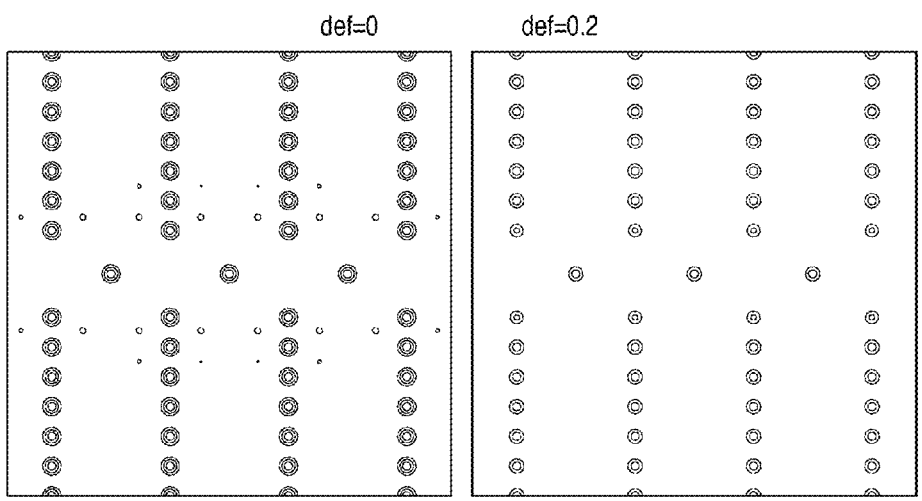
FIGS. 14A and 14B are views showing two-dimensional images of aerial images when the pattern shown in FIG. 8 is illuminated by using the effective source shown in FIG. 12.
Figures 15A, 15B:
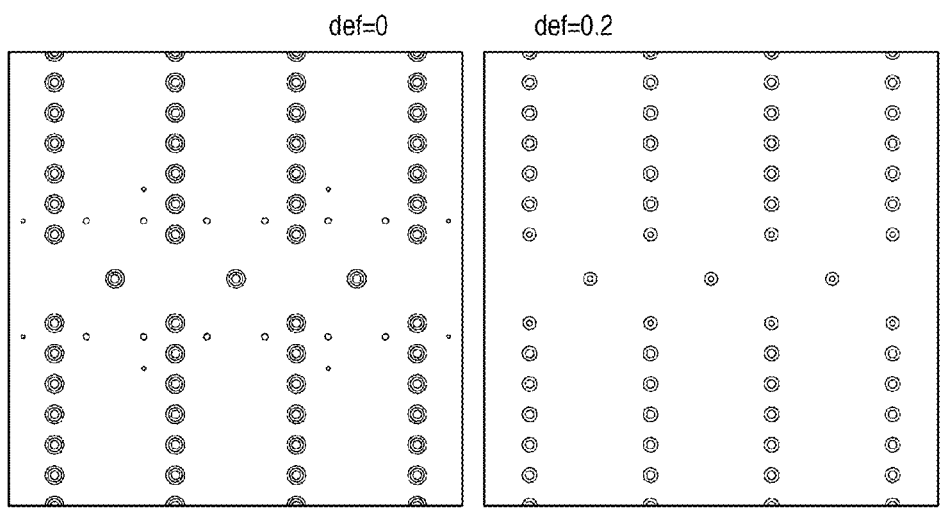
FIGS. 15A and 15B are views showing two-dimensional images of aerial images when the pattern shown in FIG. 8 is illuminated by using the effective source shown in FIG. 5.

FIGS. 13A and 13B illustrate two-dimensional images of aerial images when the pattern P1 (FIG. 8) is illuminated by using the effective source EFS10 (FIG. 11). FIGS. 14A and 14B illustrate two-dimensional images of aerial images when the pattern P1 (FIG. 8) is illuminated by using the effective source EFS11 (FIG. 12). FIGS. 15A and 15B illustrate two-dimensional images of aerial images when the pattern P1 (FIG. 8) is illuminated by using the effective source EFS0 (FIG. 5).

FIGS. 13A, 14A, and 15A each illustrates a two-dimensional image (3 μm×3 μm region) at a best-focusing position. FIGS. 13B, 14B, and 15B each illustrate a two-dimensional image (3 m×3 μm region) at a position defocused by 0.2 μm from the best-focusing position. Also, FIGS. 13A and 13B, 14A and 14B, and 15A and 15B respectively illustrate the two-dimensional images by contour lines equal to a reference slice value, contour lines 0.8 times the reference slice value, and contour lines 1.2 times the reference slice value. Note that the reference slice value is the intensity at which the width in the x-axis direction of a contact hole in the center of the mask pattern matches the target pattern data.

In the two-dimensional images shown in FIGS. 13A and 13B, the contrast increases in the y-axis direction but does not increase in the x-axis direction, when compared to the two-dimensional images shown in FIGS. 15A and 15B. Consequently, the two-dimensional images shown in FIGS. 13A and 13B are distorted into elliptic shapes.

On the other hand, the two dimensional images shown in FIGS. 14A and 14B have a higher contrast balance in the x- and y-axis directions than that of the two-dimensional images shown in FIGS. 13A and 13B, and are close to circular shapes. Note that the two-dimensional images shown in FIGS. 14A and 14B are almost equal to those shown in FIGS. 15A and 15B, but have a slightly higher contrast in isolated portions near the center.

In addition, the image performance can further be improved by optimizing the mask pattern by deforming the pattern P0 or P1 with respect to the effective source EFS10 (FIG. 11) or EFS11 (FIG. 12).

The reason why the effective source is decided not from the target pattern data but from the deformed pattern data (by OPC) will be explained below.

Figure 17:
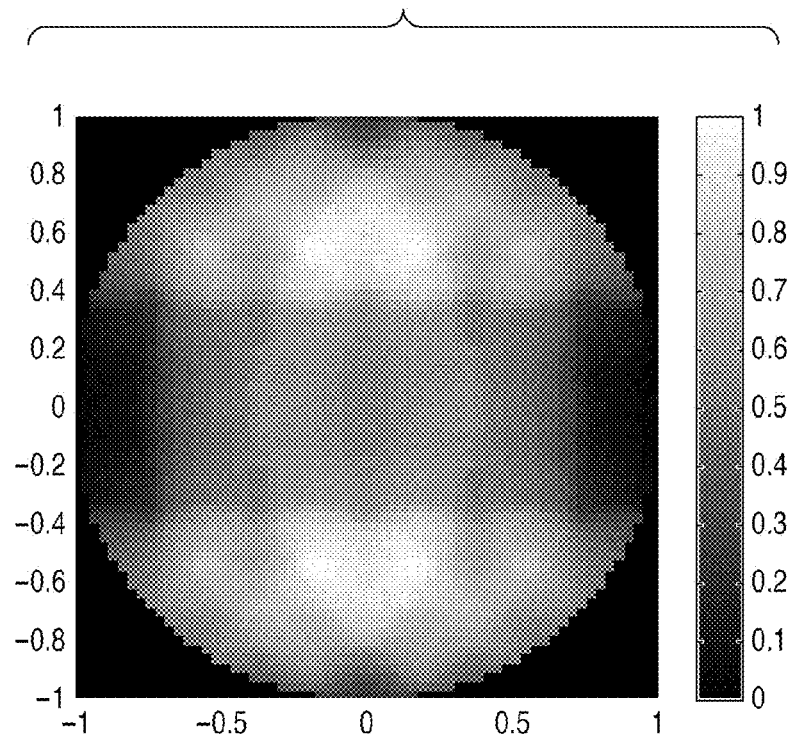
FIG. 17 is a view showing an example of an effective source (effective source data) for the target pattern data shown in FIG. 16.
Figure 40:
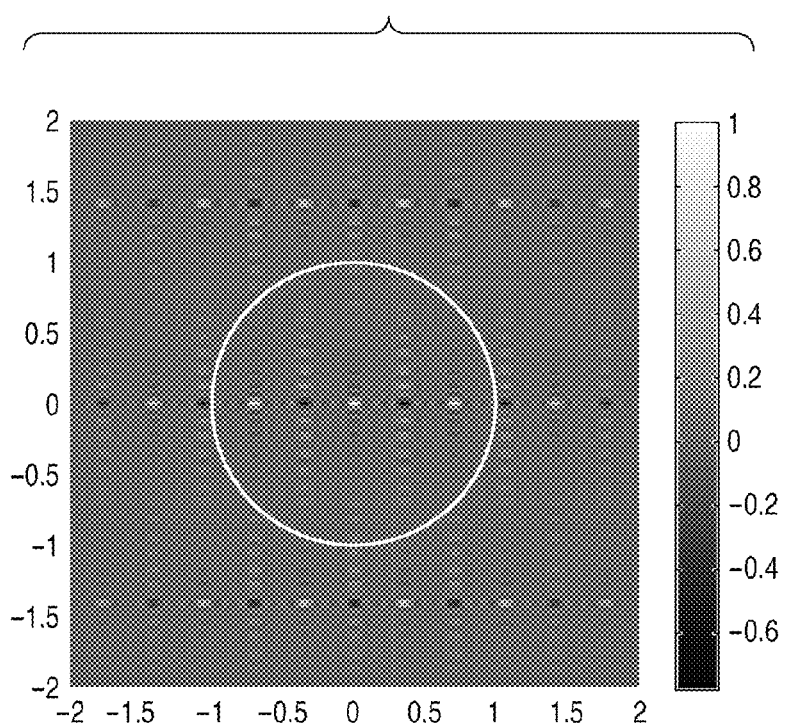
FIG. 40 is a view showing the diffracted light distribution of a target pattern.

FIG. 40 shows a diffracted light distribution formed on the pupil plane of the projection optical system by light diffracted by target pattern data shown in FIG. 16 (the same as the target pattern data shown in FIG. 4). An effective source as shown in FIG. 17 is obtained by calculating the effective source from equations (8) and (9) by using the diffracted light distribution shown in FIG. 40.

In the target pattern data shown in FIG. 16, the pitch of contact holes arranged in the x-axis direction is larger than that of contact holes arranged in the y-axis direction. As shown in FIG. 40, therefore, the diffracted light distribution has a relatively small pitch in the x direction, and a relatively large pitch in the y direction. Accordingly, the effective source shown in FIG. 17 is like a dipole shape. This effective source is attaching importance to two-beam interference (see FIG. 6A-b).

When compared to this, in the diffracted light distribution shown in FIG. 9 obtained after the above-mentioned assist pattern is inserted, diffracted light concentrate to a few points, and there is no small pitch in the x direction. This eliminates the distribution in the central portion of the light source, and quadrupole distribution is added to the strong dipole distribution in the y direction.

Generally, target patterns often include various pitches, and the diffracted light incident direction and pitch vary. If an optimum light source is obtained from a diffracted light distribution like this, the distribution blurs as a whole. Even when an assist pattern is inserted later, therefore, it is impossible to obtain the effect of the assist pattern.

Also, an isolated pattern forms a light source in which the distribution concentrates near the center. Accordingly, no assist pattern can be inserted later because there is no room for inserting any assist pattern.

When an assist pattern is inserted by using an obliquely incident light source as an initial light source, diffracted light concentrate to a few points, the above-mentioned matters may not be an issue.

When the target pattern (FIG. 16) is illuminated by using the effective source shown in FIG. 17, the image performance of dense holes arranged in the y-axis direction increases, but the image performance of isolated holes decreases. Likewise, even when the mask pattern is optimized by using the effective source shown in FIG. 17, it is very difficult to increase the performance around the isolated holes. When the optimization of the mask pattern and that of the effective source are repeated, it may be possible to finally obtain a combination of the mask pattern and effective source by which the performance of the whole pattern increases. However, the process often takes an enormous time.

In the first embodiment, therefore, the effective source is not directly decided from the target pattern data, but decided after the deformed pattern data in which the assist pattern is inserted is obtained.

As described above, to obtain an optimum effective source for a pattern including an assist pattern, it is important to decide the effective source after deformed(corrected) pattern data in which the assist pattern is inserted is obtained. To obtain the pattern including the assist pattern, it is also possible to obtain deformed (corrected) pattern data by deciding the position of the assist pattern by a rule base.

In a second embodiment, another example in which an effective source (effective source data) is decided.

An actual mask pattern includes a plurality of different patterns. When calculating an approximate aerial image, however, only a pattern in a finite region can be simulated because the number of times of pupil sampling is limited. It is difficult even for periodical simulation to include the same number of periods in the x- and y-axis directions. Also, it is sometimes impossible to perform calculations by loading the whole mask pattern at once.

In this case, the mask pattern is to be divided into a plurality of regions, decide an effective source while weighting the ratio of the pattern in the plurality of regions, and add the effective sources in the plurality of regions.

Figure 18:
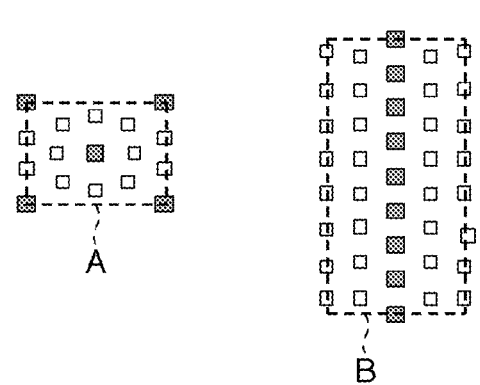
FIG. 18 is a view showing an example in which the mask pattern data shown in FIG. 8 is divided into a plurality of regions.
Figure 19:
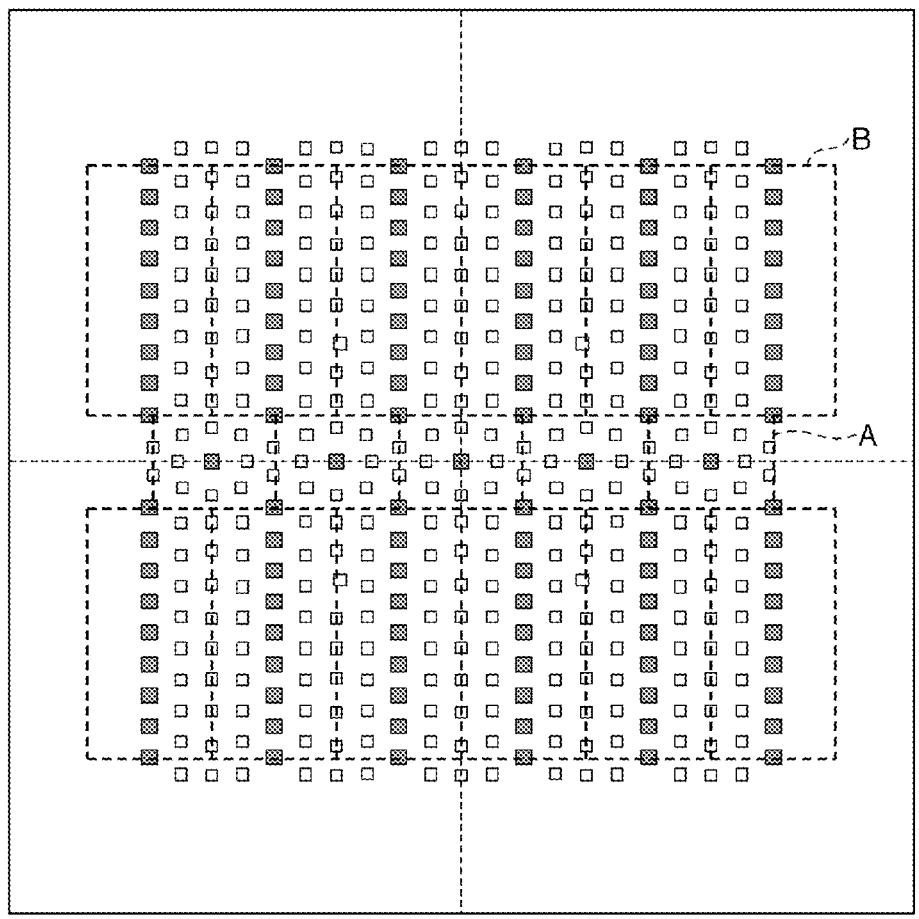
FIG. 19 is a view showing the state in which the mask pattern data shown in FIG. 8 is divided into a plurality of regions.

For example, a pattern P1 (FIG. 8) can be divided into a region containing an element A and a region containing an element B as shown in FIG. 18. Therefore, the pattern P1 (FIG. 8) for forming the target pattern (FIG. 4) is divided into a plurality of regions as shown in FIG. 19. In FIGS. 18 and 19, gray squares indicate a main pattern, and white squares indicate an assist pattern.

Referring to FIG. 19, the pattern P1 (FIG. 8) includes five periods of the region containing the element A, and ten periods (including half periods right and left regions) of the region containing the element B. Accordingly, when the effective source is optimized for the pattern P1 (FIG. 8), an effective source more optimum for the region containing the element B is obtained. Therefore, the region containing the element A is weighted in accordance with equation (10) so as to make the pattern ratio (element ratio) close to that of the actual mask pattern. It is also possible to weight a low-contrast element among the elements of the mask pattern, and perform illumination by emphasizing the element.

As explained in the first embodiment, the contrast of the region containing the element B including isolated contact holes tends to decrease. As shown in FIG. 20, therefore, weighting is performed to emphasize a region at surrounded by the dotted lines. As a consequence, an effective source as shown in FIG. 21 is obtained. The effective source shown in FIG. 21 will be referred to as an effective source EFS2 hereinafter.

Figure 22:
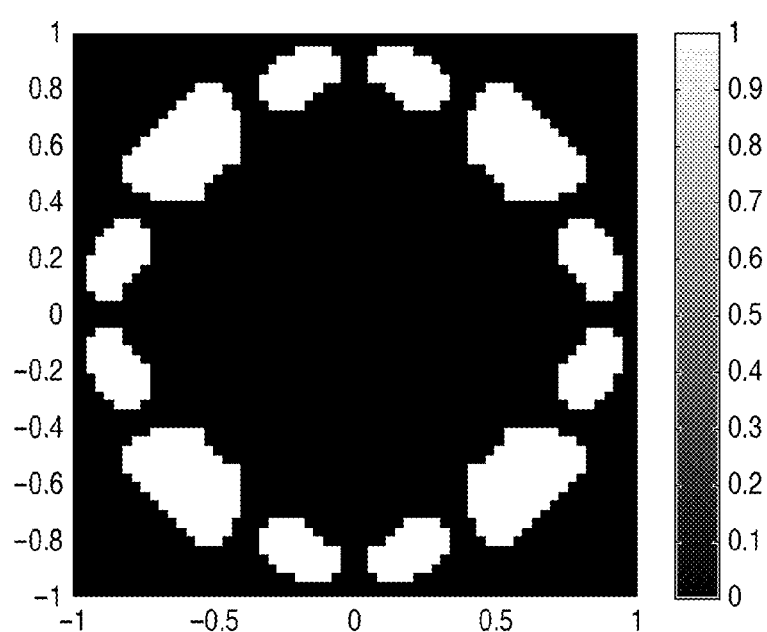
FIG. 22 is a view showing an effective source (effective source data) obtained by setting an intensity equal to or higher than a predetermined threshold value to 1 and an intensity lower than the predetermined threshold value to zero in the effective source shown in FIG. 21.

FIG. 22 shows an effective source obtained by setting 1 to an intensity higher than a predetermined threshold value and by setting zero to an intensity lower than the threshold value to zero in the light source EFS2, and by taking account of the symmetry of the effective source from the symmetry of the mask pattern. When the predetermined threshold value is one, the maximum image performance is obtained. The effective source shown in FIG. 22 will be referred to as an effective source EFS21 hereinafter.

Figure 23:
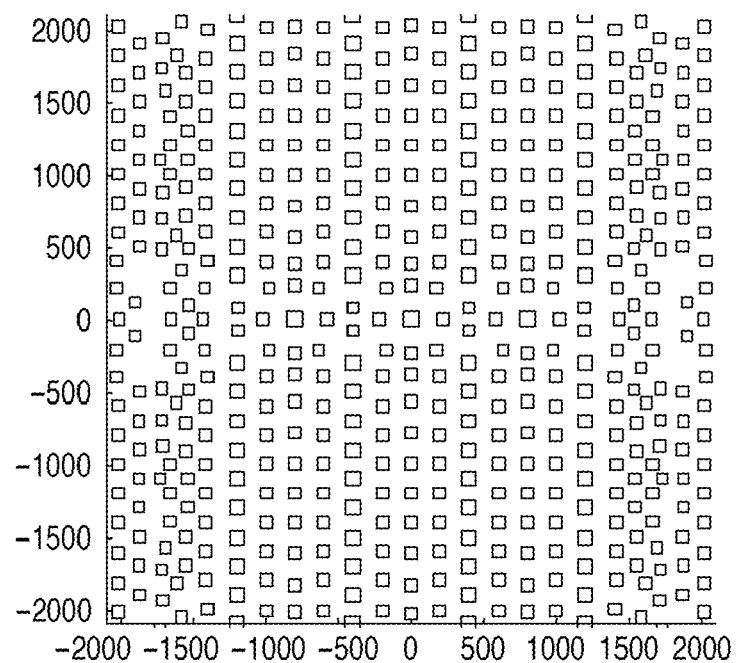
FIG. 23 is a view showing an example of mask pattern data obtained in the second embodiment.

Deformed pattern data 402 as shown in FIG. 23 can be obtained by deforming the main pattern (i.e., correcting the bias of the hole width), and inserting the assist pattern again, with respect to the effective source EFS21. The deformed pattern data 402 shown in FIG. 23 will be referred to as a pattern P21 hereinafter.

When the pattern P21 (FIG. 23) was illuminated by using the effective source EFS21 (FIG. 22), a two-dimensional image of an aerial image was very good.

In order to simulate the exposure result when illuminating the pattern P21 (FIG. 23) by using the effective source EFS21 (FIG. 22), the image performance was evaluated by calculating a strict aerial image. As shown in FIG. 24, the position of isolated contact holes (iso), semi-isolated contact holes (semi-iso), and dense contact holes (dense) were the evaluating point, and the line width (CD) and NILS were evaluation amounts. The CD was defined as follows; it is the square root of products of the line width of x- and y-axis directions.

Figure 25A:
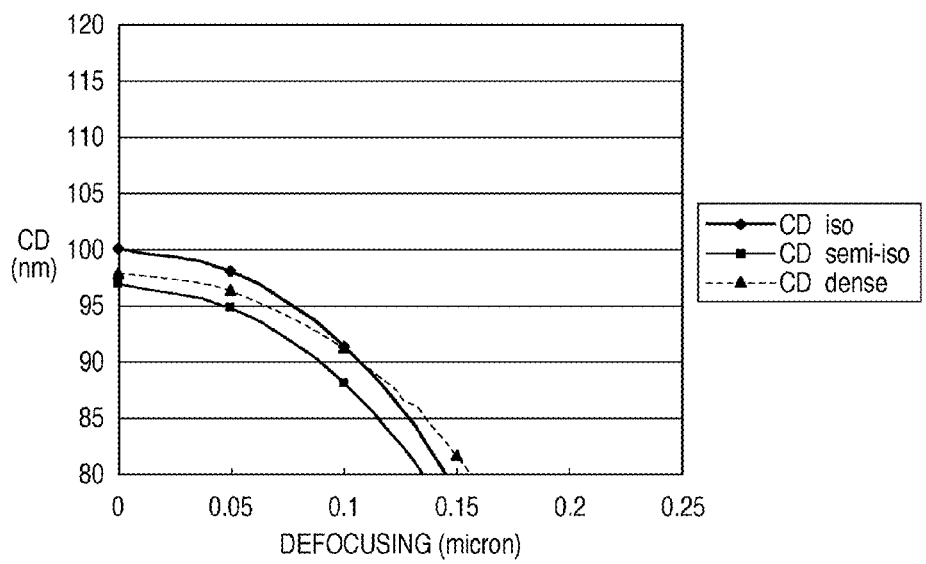
FIG. 25A is a graph showing the change (evaluation amount) in line width (CD) as a function of defocusing in isolated contact holes, semi-isolated contact holes, and dense contact holes in the target pattern data shown in FIG. 4.
Figure 25B:
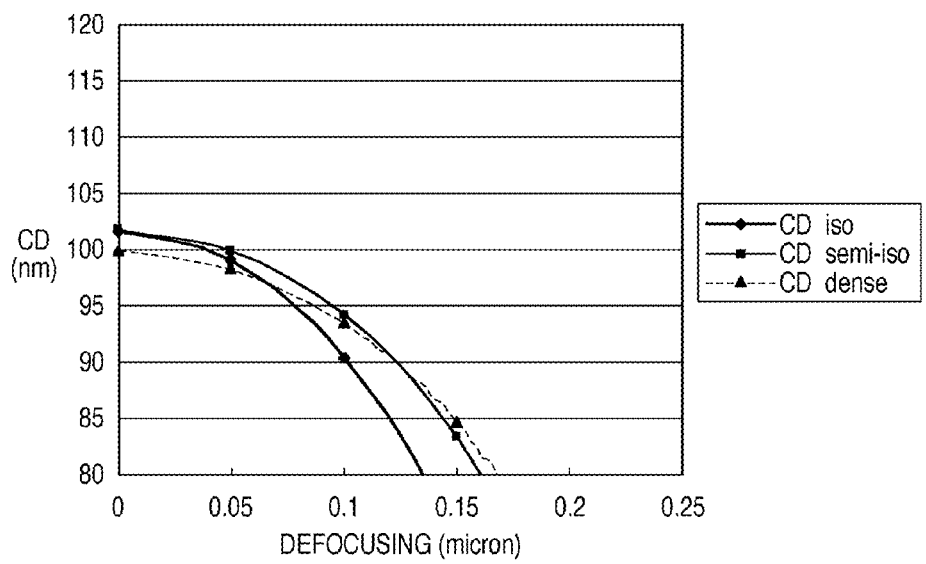
FIG. 25B is a graph showing the change (evaluation amount) in line width (CD) as a function of defocusing in isolated contact holes, semi-isolated contact holes, and dense contact holes in the target pattern data shown in FIG. 4.

FIGS. 25A and 25B illustrate the change of CD for defocus at isolated contact holes (iso), semi-isolated contact holes (semi-iso), and dense contact holes (dense). FIG. 25A shows the evaluation results of the line width (CD) in an aerial image when the pattern P1 (FIG. 8) was illuminated by using an effective source EFS0 (FIG. 5). FIG. 25B shows the evaluation results of the line width (CD) in an aerial image when the pattern P21 (FIG. 23) was illuminated by using the effective source EFS21 (FIG. 22). In FIGS. 25A and 25B, defocusing is plotted on the abscissa, and the line width (CD) is plotted on the ordinate.

Figure 26A:
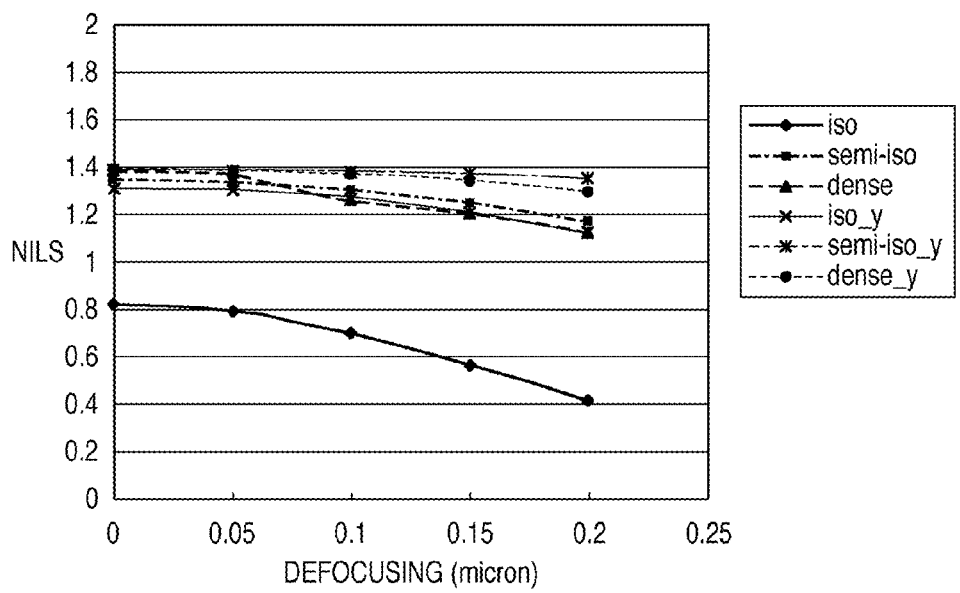
FIG. 26A is a graph showing the change (evaluation amount) in NILS as a function of defocusing in isolated contact holes, semi-isolated contact holes, and dense contact holes in the target pattern data shown in FIG. 4.
Figure 26B:
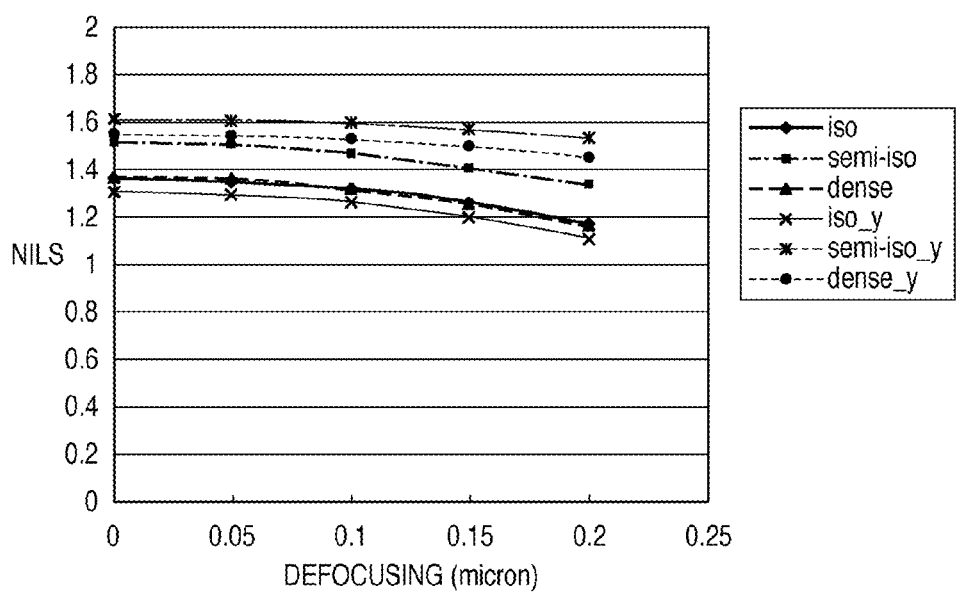
FIG. 26B is a graph showing the change (evaluation amount) in NILS as a function of defocusing in isolated contact holes, semi-isolated contact holes, and dense contact holes in the target pattern data shown in FIG. 4.

FIGS. 26A and 26B illustrate the change of NILS for defocus at isolated contact holes (iso), semi-isolated contact holes (semi-iso), and dense contact holes (dense). FIG. 26A shows the evaluation results of the NILS in an aerial image when the pattern P1 (FIG. 8) was illuminated by using the effective source EFS0 (FIG. 5). FIG. 26B shows the evaluation results of the NILS in an aerial image when the pattern P21 (FIG. 23) was illuminated by using the effective source EFS21 (FIG. 22). In FIGS. 26A and 26B, defocusing is plotted on the abscissa, and the NILS is plotted on the ordinate.

The comparison of FIGS. 25A, 25B, 26A, and 26B reveals that the uniformity of both the line width (CD) and NILS increased when the pattern P21 (FIG. 23) was illuminated by using the effective source EFS21 (FIG. 22). Also, the NILS and defocusing characteristic of the isolated contact holes (iso) are inferior to those of the dense contact holes (dense) as described previously, but they have improved.

As described above, the image performance can further be improved by dividing a mask pattern into a plurality of regions, and deciding an effective source while weighting the plurality of regions in accordance with the pattern. The effective source should be decided in accordance with the image performance (e.g., which of the contrast and CD uniformity is more important). In step S120, therefore, evaluation is to be performed by using an evaluation amount and evaluation criterion corresponding to the image performance.

In a third embodiment, an example in which mask data 404 and effective source data 405 are generated by modifying target pattern data 401 will be explained. When modifying the target pattern data 401, a target pattern is modified without changing the minimum pitch of the target pattern. The layout of pattern is changed.

As explained in the first embodiment, it is difficult to obtain an effective source capable of increasing the image performance of an isolated fine pattern, keeping the high performance of the dense pattern. In the third embodiment, a method is related to the optimization of an effective source for such pattern.

More specifically, one of the pitches in the x and y directions of a sparse fine pattern make modified without changing the pitch of a dense portion, and a pitch from which the amount of evaluation becomes improved is examined.

On the other hand, if fine patterns are densely arranged to make the portion difficult to resolve and there is a space for increasing the pattern area, a position where a target evaluation amount becomes improved can be examined by increasing one of the pitches in the x and y directions.

Figure 27:
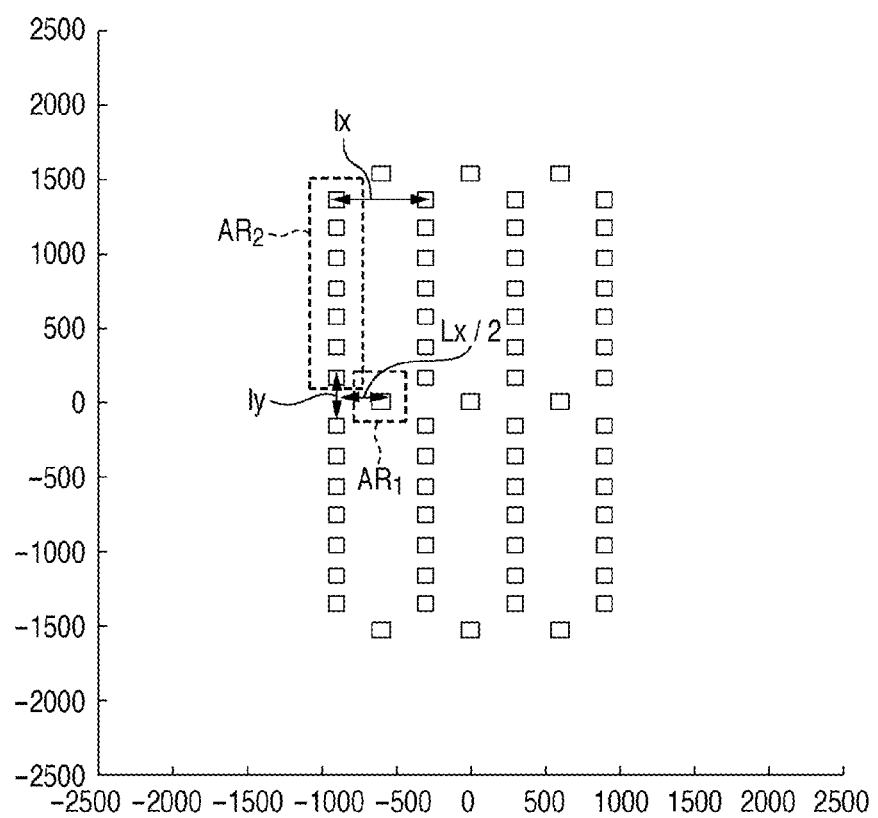
FIG. 27 is a view for explaining the deformation of target pattern data in the third embodiment.

For example, as shown in FIG. 27, target pattern data is separated into an isolated contact hole area $AR_1$ and dense contact hole area $AR_2$, and the coordinates of the center of an element are modified without changing relative coordinates in the isolated contact hole area $AR_1$ and dense contact hole area $AR_2$. More specifically, letting lx and ly be the intervals between the centers of elements, only lx and ly are changed.

First, as shown in FIGS. 28A and 29A, assume that lx=800 (nm) and ly=600 (nm) in an unmodified target pattern. An approximate aerial image is calculated while changing lx and ly. The approximate aerial image can be calculated by using initial data of an effective source or pre-decided effective source data. When lx=800 (nm) was decreased in the target pattern shown in FIG. 28A, the defocusing characteristic improved when lx=352 (nm). Also, when lx=800 (nm) was decreased in the target pattern shown in FIG. 29A, the defocusing characteristic improved when lx=550 (nm) as well. On the other hand, although ly=600 (nm) was changed in the target patterns shown in FIGS. 28A and 29A, the image performance was best when ly=600 (nm). As shown in FIG. 28B, therefore, the target pattern shown in FIG. 28A is modified into a target pattern in which lx=352 (nm) and ly=600 (nm). Likewise, as shown in FIG. 29B, the target pattern shown in FIG. 29A is modified into a target pattern in which lx=550 (nm) and ly=600 (nm).

Figure 30:
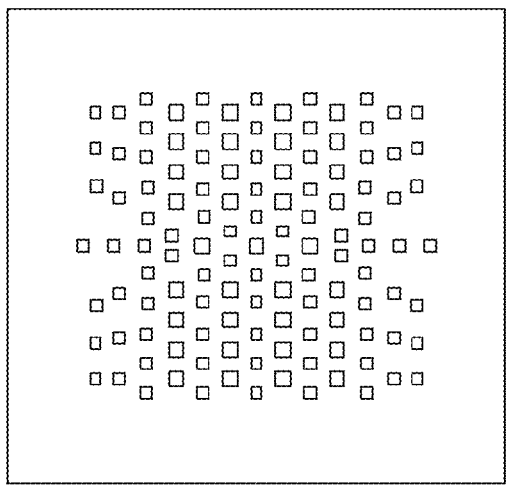
FIG. 30 is a view showing a mask pattern (mask data or deformed pattern data) obtained from the target pattern (target pattern data) shown in FIG. 28B.
Figure 31:
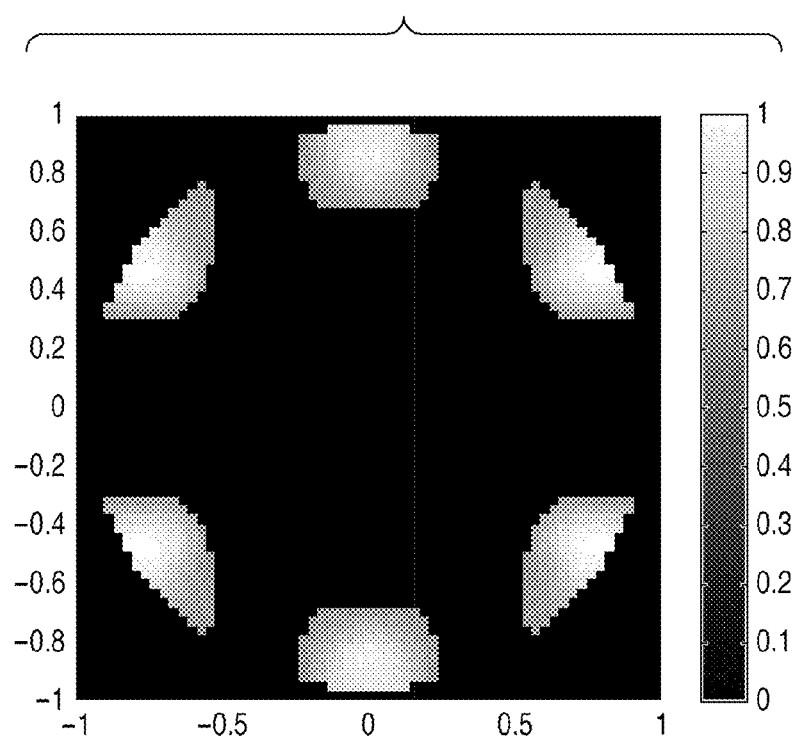
FIG. 31 is a view showing an effective source (effective source data) obtained from the mask pattern shown in FIG. 30.

FIG. 30 shows a mask pattern (mask data or deformed pattern data) obtained from the target pattern (target pattern data) shown in FIG. 28B. FIG. 31 shows an effective source (effective source data) obtained from the mask pattern shown in FIG. 30. FIG. 32 shows a mask pattern (mask data or deformed pattern data) obtained from the target pattern (target pattern data) shown in FIG. 29B. Although no scale is shown in FIGS. 30 and 32, a portion (large pattern) corresponding to a main pattern is the same as the target pattern because the main pattern is not deformed. In the following description, the mask pattern shown in FIG. 30 will be referred to as a pattern P3, the effective source shown in FIG. 31 will be referred to as an effective source EFS30, and the mask pattern shown in FIG. 32 will be referred to as a pattern P4.

These results can also be used to improve the target pattern. It is meaningful to propose a plurality of good target patterns in order to decide the target pattern.

A two-dimensional image obtained from the pattern P3 and effective source EFS30 was very good. To simulate the exposure result when the pattern P3 (FIG. 30) is illuminated by using the effective source EFS30 (FIG. 31) as in the second embodiment, the image performance is evaluated by calculating a strict aerial image.

In the third embodiment, the position of isolated contact holes (iso), semi-isolated contact holes (semi-iso), and dense contact holes (dense) were the evaluating point, and the line width (CD) and NILS were evaluation amounts (see FIG. 20). The CD was defined as follows; it is the square root of products of the line width of x- and y-axis directions.

FIG. 33 shows the change of CD for defocus at isolated contact holes (iso), semi-isolated contact holes (semi-iso), and dense contact holes (dense). That is, FIG. 33 shows the evaluation results of the CD in an aerial image when the pattern P3 (FIG. 30) was illuminated by using the effective source EFS30 (FIG. 31). In FIG. 33, defocusing is plotted on the abscissa, and the CD is plotted on the ordinate.

FIG. 34 shows the change of NILS as a function of defocus at the isolated contact holes (iso), semi-isolated contact holes (semi-iso), and dense contact holes (dense). That is, FIG. 34 shows the evaluation results of an aerial image when the pattern P3 (FIG. 30) was illuminated by using the effective source EFS30 (FIG. 31). In FIG. 34, the defocus is plotted on the abscissa, and the NILS is plotted on the ordinate.

Referring to FIGS. 33 and 34, when the pattern P3 (FIG. 30) was illuminated by using the effective source EFS30 (FIG. 31), the uniformity of both the CD and NILS increased. In addition, the uniformity of the NILS was higher than that of the second embodiment. Also, as described previously, the contrast and defocusing characteristic of the isolated contact holes (iso) were inferior to those of the dense contact holes (dense), but they were improved.

Figure 35:
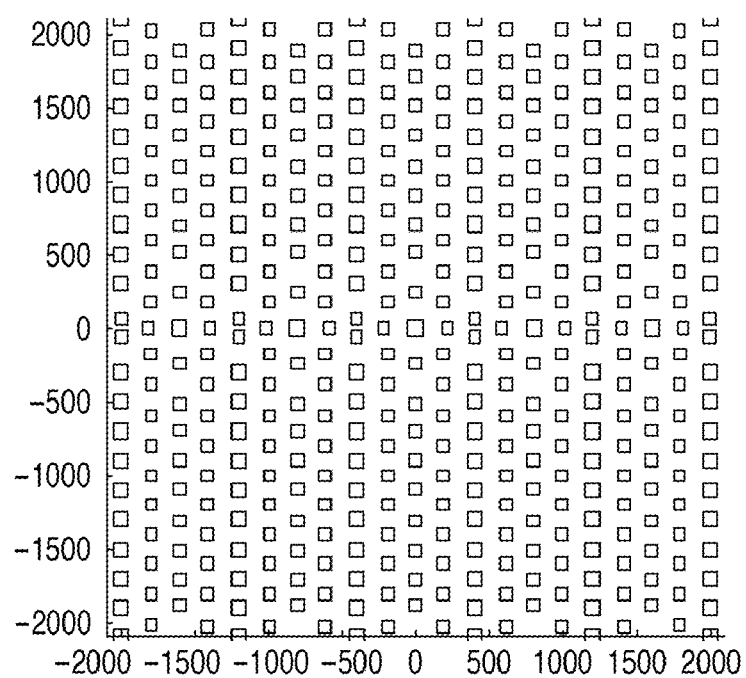
FIG. 35 is a view showing an example of a mask pattern (mask data or deformed pattern data) obtained in the third embodiment.

When a pattern P0 (FIG. 4) is optimized by using the effective source EFS30 (FIG. 31), a mask pattern as shown in FIG. 35 is obtained. The mask pattern shown in FIG. 35 will be referred to as a pattern P5 hereinafter.

To simulate the exposure result when the pattern P5 (FIG. 35) is illuminated by using the effective source EFS30 (FIG. 31), the image performance is evaluated by calculating a strict aerial image.

As described above, the position of isolated contact holes (iso), semi-isolated contact holes (semi-iso), and dense contact holes (dense) were the evaluating point, and CD and NILS were evaluation amounts (see FIG. 20).

Figure 36:
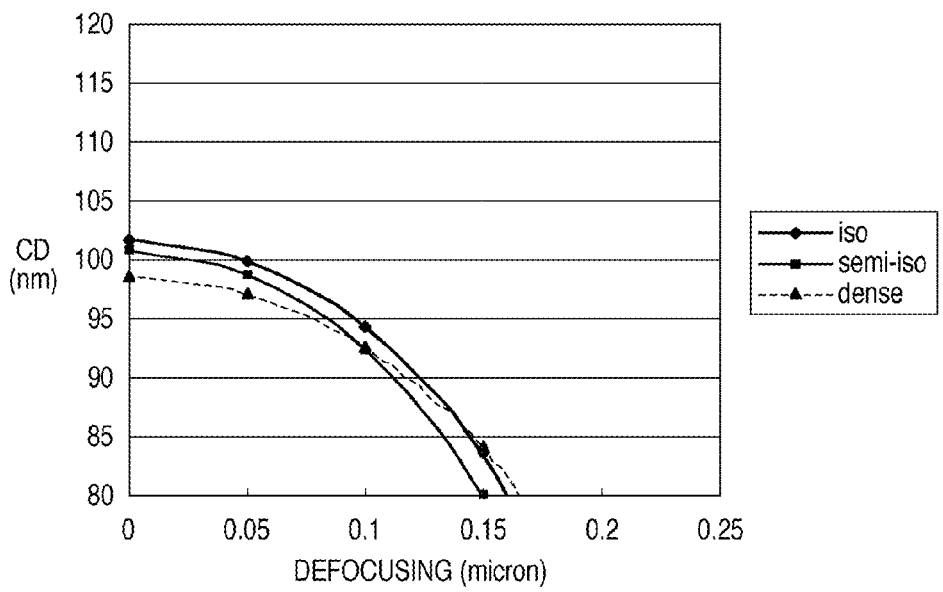
FIG. 36 is a graph showing the change (evaluation amount) in line width (CD) as a function of defocusing in isolated contact holes, semi-isolated contact holes, and dense contact holes.

FIG. 36 shows the change of the CD for the defocus at the isolated contact holes (iso), semi-isolated contact holes (semi-iso), and dense contact holes (dense). That is, FIG. 36 shows the evaluation results of the CD in an aerial image when the pattern P5 (FIG. 35) was illuminated by using the effective source EFS30 (FIG. 31). In FIG. 36, defocusing is plotted on the abscissa, and the line width (CD) is plotted on the ordinate.

Figure 37:
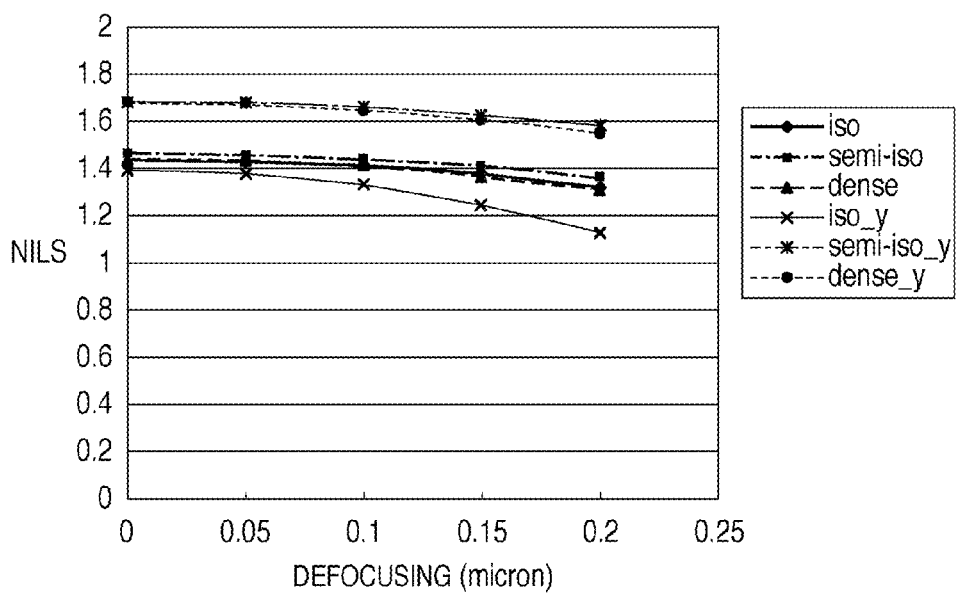
FIG. 37 is a graph showing the change (evaluation amount) in NILS as a function of defocusing in isolated contact holes, semi-isolated contact holes, and dense contact holes.

FIG. 37 shows the change (evaluation amount) in NILS for the defocus at the isolated contact holes (iso), semi-isolated contact holes (semi-iso), and dense contact holes (dense). That is, FIG. 37 shows the evaluation results of an aerial image when the pattern P5 (FIG. 35) was illuminated by using the effective source EFS30 (FIG. 31). In FIG. 37, defocusing is plotted on the abscissa, and the NILS is plotted on the ordinate.

Referring to FIGS. 36 and 37, when the pattern P5 (FIG. 35) was illuminated by the effective source EFS30 (FIG. 31), the uniformity of both the line width (CD) and NILS increased. In addition, the uniformity of the NILS was slightly higher than that of the second embodiment. Also, as described earlier, the contrast and defocusing characteristic of the isolated contact holes (iso) were inferior to those of the dense contact holes (dense), but they were improved.

When deciding an effective source, it is very effective to decide a mask pattern by inserting an assist pattern after modifying a target pattern, and decide the effective source from the diffracted light distribution of the mask pattern. In the decision of an effective source, the interference between a main pattern and another main pattern (the interference between the main patterns) and the interference between the main pattern and an assist pattern are important, but the interference between the assist patterns is not important. Accordingly, an effective source is to be decided after inserting an assist pattern by modifying a target pattern so as to eliminate unnecessary interferences from the interferences between the assist patterns, i.e., so as to reduce the interferences between the assist patterns. If the target pattern is a dense pattern in which no assist pattern can be inserted, an effective source can be decided after the main pattern of the target pattern is corrected.

Figure 38:
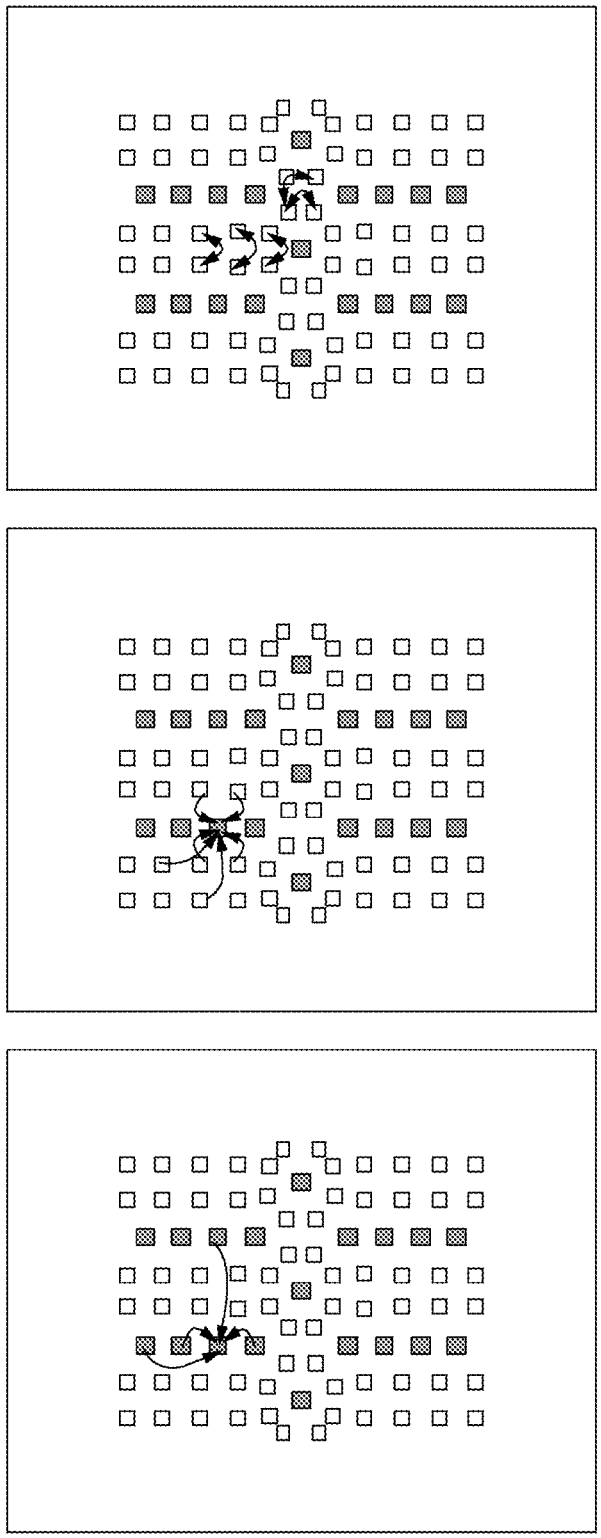
FIGS. 38A to 38C are views for explaining the interferences between main patterns, those between the main pattern and assist patterns, and those between the assist patterns.

The interference between a main pattern and another main pattern (the interference between the main patterns), the interference between the main pattern and an assist pattern, and the interference between the assist patterns will be explained below with reference to FIGS. 38A to 38C. FIGS. 38A to 38C illustrate mask patterns in which each gray square indicates the main pattern and each white square indicates the assist pattern.

FIG. 38A conceptually shows the interference between a main pattern and other main patterns. As indicated by the arrows in FIG. 38A, main patterns around a given main pattern interfere with the given main pattern. Since the main pattern overlaps to the target pattern, these interferences have to be taken into consideration.

FIG. 38B conceptually shows the interferences between a main pattern and assist patterns. As indicated by the arrows in FIG. 38B, assist patterns around a given main pattern interfere with the given main pattern. These interferences enhance the main pattern. In other words, a light source distribution derived from these interferences concentrate light to the target pattern when the pattern is a positive pattern. Therefore, these interferences have effect on the generation of the target pattern.

FIG. 38C conceptually shows the interferences between assist patterns. As indicated by the arrows in FIG. 38C, assist patterns interfere with each other. These interferences emphasize the assist patterns. A light source distribution derived from these interferences does not concentrate light to the target pattern in some cases.

Accordingly, it is effective that the target pattern be modified so as to eliminate the adverse effect of the interferences between the assist patterns on the target pattern (i.e., so as to reduce the interferences between the assist patterns).

For example, when an effective source is decided by a mask pattern, such as the pattern P3 (FIG. 30), which eliminates the interferences between the assist patterns, an effective source having better performance can be obtained for the target pattern. Therefore, it is sometimes unpreferable to decide an effective source from the pattern P4.

The image performance is favorable, however, when combining the effective source EFS30 (FIG. 31) obtained from the pattern P3 (FIG. 30) and the pattern P4 (FIG. 32). Similarly, the image performance is favorable when combining the effective source EFS30 (FIG. 31) obtained from the pattern P3 (FIG. 30) and the pattern P5 (FIG. 35).

Figure 39:
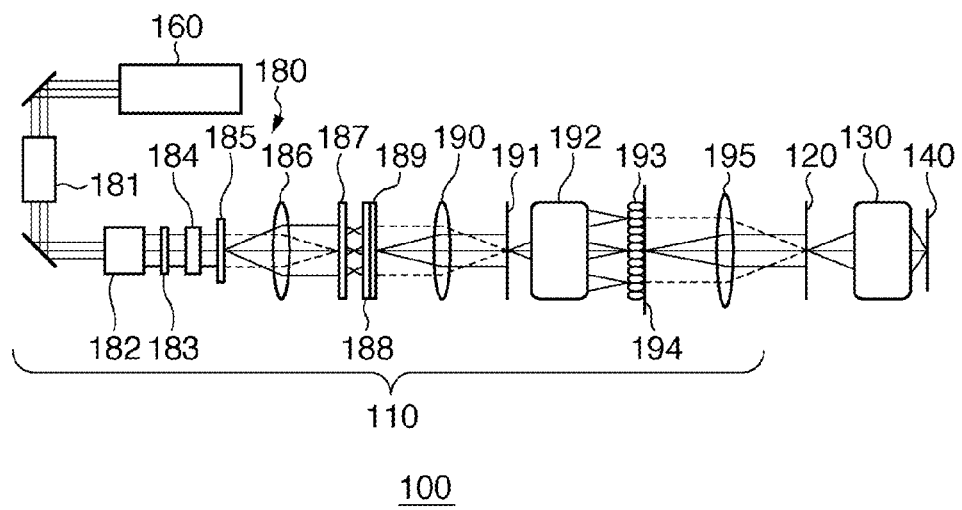
FIG. 39 is a schematic block diagram showing the arrangement of an exposure apparatus.

An exposure apparatus 100 will be explained below with reference to FIG. 39. FIG. 39 is a schematic block diagram showing the arrangement of the exposure apparatus 100. The exposure apparatus 100 uses a mask 120 fabricated based on mask data generated by executing the generation program described previously. Also, the exposure apparatus 100 forms, in an illumination optical system 180, an effective source corresponding to effective source data generated by executing the above-mentioned generation program.

In this embodiment, the exposure apparatus 100 is a projection exposure apparatus that exposes patterns of the mask 120 to a wafer 140 by the step-and-scan method. However, the exposure apparatus 100 is also applicable to the step-and-repeat method or another exposure method.

As shown in FIG. 39, the exposure apparatus 100 includes an illumination apparatus 110, a reticle stage (not shown) for supporting the mask 120, a projection optical system 130, and a wafer stage (not shown) for supporting the wafer 140.

The illumination apparatus 110 illuminates the mask 120 having circuit patterns to be transferred, and has a light source 160 and the illumination optical system 180.

The light source 160 is, for example, an excimer laser such as an ArF excimer laser having a wavelength of about 193 nm or a KrF excimer layer having a wavelength of about 248 nm. However, the light source 160 is not limited to the excimer laser, and may also be an $F_2$ laser having a wavelength of about 157 nm or a narrow-band mercury lamp.

The illumination optical system 180 is an optical system that illuminates the mask 120 by using light from the light source 160. In this embodiment, the mask 120 is illuminated by forming an effective source corresponding to effective source data generated by executing the above-mentioned generation program.

The illumination optical system 180 includes a guiding optical system 181, beam shaping optical system 182, polarization controller 183, phase controller 184, exit angle saving optical element 185, relay optical system 186, and multi-beam generator 187. The illumination optical system 180 also includes a polarization state adjusting unit 188, computer hologram 189, relay optical system 190, aperture 191, zoom optical system 192, multi-beam generator 193, aperture stop 194, and irradiation unit 195.

The guiding optical system 181 deflects the light from the light source 160 and guides the light to the beam shaping optical system 182. The beam shaping optical system 182 converts the aspect ratio of the dimensions of the sectional shape of the light from the light source 160 into a desired value (e.g., converts the sectional shape from a rectangle to a square), thereby shaping the sectional shape of the light from the light source 160 into a desired shape. The beam shaping optical system 182 forms a beam having a size and divergent angle to illuminate the multi-beam generator 187.

The polarization controller 183 includes a linear polarizer and has a function of removing unnecessary polarization components. The light from the light source 160 can be efficiently converted into desired linearly polarized light by minimizing the polarization components to be removed (shielded) by the polarization controller 183.

The phase controller 184 gives a $\lambda/4$ phase difference to the linearly polarized light obtained by the polarization controller 183, thereby converting the light into circularly polarized light.

The exit angle saving optical element 185 includes, for example, an optical integrator (e.g., a fly-eye lens including a plurality of microlenses or a fiber bundle), and outputs light at a predetermined divergent angle.

The relay optical system 186 concentrates the exit light from the exit angle saving optical element 185 to the multi-beam generator 187. The exit surface of the exit angle saving optical element 185 and the incident surface of the multi-beam generator 187 is given a Fourier transform relationship (the relationship between an object plane and pupil plane or between a pupil plane and image plane) by the relay optical system 186.

The multi-beam generator 187 includes an optical integrator (e.g., a fly-eye lens including a plurality of microlenses or a fiber bundle) for uniformly illuminating the polarization state adjusting unit 188 and computer hologram 189. The exit surface of the multi-beam generator 187 forms a light source surface including a plurality of point light sources. The exit light from the multi-beam generator 187 enters as circularly polarized light into the polarization state adjusting unit 188.

The polarization state adjusting unit 188 gives a $\lambda/4$ phase difference to the circularly polarized light obtained by the phase controller 184, thereby converting the light into linearly polarized light having a desired polarization direction. The exit light from the polarization state adjusting unit 188 enters as the linearly polarized light into the computer hologram 189.

The computer hologram 189 forms a light intensity distribution in the position of the aperture 191 via the relay optical system 190. The computer hologram 189 forms, for example, the effective sources EFS11, EFS21, and EFS30 described above. The computer hologram 189 can also form annular illumination, quadrupole illumination, and the like. A plurality of computer holograms 189 for forming the different effective sources described above are arranged in a switching unit such as a turret. Any of the various effective sources can be implemented by placing, in the optical path of the illumination optical system 180, the computer hologram 189 corresponding the effective source data generated by the processing apparatus 1 described earlier.

The aperture 191 has a function of passing only the light intensity distribution formed by the computer hologram 189.

The computer hologram 189 and aperture 191 are arranged to have a Fourier transform plane relationship.

The zoom optical system 192 enlarges the light intensity distribution formed by the computer hologram 189 at a predetermined magnification, and projects the enlarged distribution onto the multi-beam generator 193.

The multi-beam generator 193 is placed on the pupil plane of the illumination optical system 180, and forms, on the exit surface, a light source image (effective source distribution) corresponding to the light intensity distribution formed in the position of the aperture 191. In this embodiment, the multi-beam generator 193 is an optical integrator such as a fly-eye lens or cylindrical lens array. Note that the aperture stop 194 is placed near the exist surface of the multi-beam generator 193.

The irradiation unit 195 has a condenser optical system and the like, and illuminates the mask 120 with the effective source distribution formed on the exit surface of the multi-beam generator 193.

The mask 120 is fabricated based on the mask data generated by the processing apparatus 1 described above, and has a circuit pattern (main pattern) to be transferred and an assist pattern. The mask 120 is supported and driven by a mask stage (not shown). Diffracted light output from the mask 120 is projected onto the wafer 140 via the projection optical system 130. Since the exposure apparatus 100 is a step-and-scan type exposure apparatus, the patterns of the mask 120 are transferred onto the wafer 140 by scanning the mask 120 and wafer 140.

The projection optical system 130 is an optical system that projects the patterns of the mask 120 onto the wafer 140. The projection optical system 130 can be a refracting system, cata-dioptric system, or reflecting system.

The wafer 140 is a substrate onto which the patterns of the mask 120 are to be projected (transferred), and is supported and driven by the wafer stage (not shown). However, a glass plate or another substrate may also be used instead of the wafer 140. The wafer 140 is coated with a photoresist.

During exposure, the illumination optical system 180 illuminates the mask 120 with the light emitted by the light source 160. The projection optical system 130 forms, on the wafer 140, an image of the light reflecting the patterns of the mask 120. The mask 120 fabricated based on mask data generated by the above-mentioned processing apparatus 1 is illuminated by an effective source corresponding to effective source data generated by the processing apparatus 1. Accordingly, the exposure apparatus 100 can economically provide a high-quality device (e.g., a semiconductor element, LCD element, imaging element (CCD or the like), or thin-film magnetic head) at high throughput. This device is fabricated through a step of exposing a substrate (e.g., a wafer or glass plate) coated with a photoresist (photosensitive agent) by using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-181984, filed on Jul. 11, 2008, which is hereby incorporated by reference herein in its entirety.

What is claimed is:

1. A method comprising:
generating, by a computer, effective source data and mask data to be used in an exposure apparatus including an illumination optical system which illuminates a mask by using light from a light source, and a projection optical system which projects a pattern of the mask onto a substrate; and
fabricating a mask based on the generated mask data,
wherein the mask data generation step includes
setting a target pattern to be formed on the substrate, an effective source, and an exposure parameter settable in the exposure apparatus,
calculating a first aerial image to be formed on an image plane of the projection optical system, based on the set target pattern, effective source, and exposure parameter,
deciding a pattern of the mask based on the calculated first aerial image,
calculating a diffracted light distribution to be formed on a pupil plane of the projection optical system, based on the decided pattern,
deciding a new effective source based on the calculated diffracted light distribution and the set exposure parameter, and changing the set effective source to the new effective source,
calculating a second aerial image to be formed on the image plane, based on the decided mask pattern, the decided new effective source, and the set exposure parameter,
evaluating the calculated second aerial image, and determining whether the calculated second aerial image satisfies an evaluation criterion, and
generating data containing data of the decided new effective source as the effective source data, if it is determined that the calculated second aerial image satisfies the evaluation criterion, and generating data containing data of the decided pattern as the mask data,
wherein the calculating step of the first aerial image includes changing at least one of a relative position between elements of the target pattern and a shape of an element of the target pattern, and calculating the first aerial image of the changed target pattern, and
in the deciding pattern, the pattern of the mask is decided based on the calculated aerial images.

2. The method according to claim 1, wherein if it is determined that the calculated second aerial image does not satisfy the evaluation criterion, the process returns to the calculating step of the first aerial image, and an aerial image to be formed on the substrate is calculated based on the changed new effective source, the target pattern and exposure parameter, and the deciding a pattern, calculating a diffracted light distribution, the deciding new effective source, the calculating a second aerial image, and the evaluating and determining the calculated second aerial image are further executed.

3. The method according to claim 1, wherein in the calculating of the first and second aerial images, an aerial image to be formed on the image plane is calculated by using a two-dimensional transmission cross coefficient as information unique to the illumination optical system.

4. The method according to claim 1, wherein
the mask data includes a main pattern and an assist pattern, and
the main pattern is deformed in the deciding pattern such that a difference between the calculated first aerial image and the target pattern falls within an allowable range, and the assist pattern is inserted in the main pattern.

5. The method according to claim 1, wherein the calculating step of the first aerial image includes deforming the target pattern without changing a minimum pitch of the target pattern and includes calculating the first aerial image of the deformed target pattern.

6. The method according to claim 1, wherein
the mask data includes a main pattern and an assist pattern,
in the calculating of the first aerial image, the position of the target pattern is changed such that interference between the assist patterns reduces, and
the effective source is decided based on interference between the main patterns, and interference between the main pattern and the assist pattern.

7. The method according to claim 1, wherein deciding the new effective source includes
dividing the decided mask pattern into a plurality of regions,
deciding an effective source while weighting each of the divided plurality of regions, in accordance with a portion of the mask pattern existing in the region, and
superposing effective sources of the decided plurality of regions.

8. A method comprising:
generating effective source data and mask data to be used in an exposure apparatus including an illumination optical system, and a projection optical system which projects a pattern of a mask onto a substrate; and
fabricating a mask, which is illuminated with an effective source corresponding to the generated effective source data, based on the generated mask data,
wherein the effective source data and mask data generation step includes
setting a target pattern to be formed on the substrate, an effective source, and an exposure parameter settable in the exposure apparatus,
calculating a first aerial image to be formed on an image plane of the projection optical system, based on the set target pattern, effective source, and exposure parameter,
deciding a pattern of the mask based on the calculated first aerial image,
calculating a diffracted light distribution to be formed on a pupil plane of the projection optical system, based on the decided pattern, and
deciding a new effective source based on the calculated diffracted light distribution and the set exposure parameter, and changing the set effective source to the new effective source,
wherein the calculating step of the first aerial image includes changing at least one of a relative position between elements of the target pattern and a shape of an element of the target pattern, and calculating the first aerial image of the changed target pattern, and
in the deciding pattern, the pattern of the mask is decided based on the calculated aerial images.

* * * * *